United States Patent
Ely et al.

(10) Patent No.: US 10,707,032 B1
(45) Date of Patent: Jul. 7, 2020

(54) ELECTRONIC DEVICE HAVING TRAVEL-MAGNIFYING INPUT/OUTPUT STRUCTURE

(71) Applicant: Apple Inc., Cupertino, CA (US)

(72) Inventors: Colin M. Ely, Sunnyvale, CA (US); Daniel William Jarvis, Sunnyvale, CA (US); Benjamin J. Pope, Mountain View, CA (US); Erik G. de Jong, San Francisco, CA (US); Tyler S. Bushnell, Mountain View, CA (US); Christopher T. Cheng, Cupertino, CA (US); Trevor J. Ness, Santa Cruz, CA (US); William C. Lukens, San Francisco, CA (US); Steven P. Cardinali, Campbell, CA (US); Robert D. Turner, Nashville, TN (US)

(73) Assignee: APPLE INC., Cupertino, CA (US)

( * ) Notice: Subject to any disclaimer, the term of this patent is extended or adjusted under 35 U.S.C. 154(b) by 228 days.

(21) Appl. No.: 15/829,629

(22) Filed: Dec. 1, 2017

Related U.S. Application Data

(60) Provisional application No. 62/429,708, filed on Dec. 2, 2016.

(51) Int. Cl.
| | | |
|---|---|---|
| *H01H 13/14* | (2006.01) | |
| *H05K 5/00* | (2006.01) | |
| *H01H 13/04* | (2006.01) | |

(52) U.S. Cl.
CPC ............ *H01H 13/14* (2013.01); *H01H 13/04* (2013.01); *H05K 5/0017* (2013.01); *H05K 5/0086* (2013.01)

(58) Field of Classification Search
CPC ....... H01H 13/14; H01H 13/04; H05K 5/0017
USPC .......................................................... 200/341
See application file for complete search history.

(56) References Cited

U.S. PATENT DOCUMENTS

| | | | |
|---|---|---|---|
| 2,273,671 A | | 2/1942 | Ullberg |
| 3,051,805 A | | 8/1962 | Binford |
| 3,056,001 A | | 9/1962 | Fichter |
| 3,170,049 A | | 2/1965 | Clavel |
| 3,273,091 A | | 9/1966 | Wales, Jr. |
| 3,295,023 A | | 12/1966 | Peras |
| 3,678,425 A | | 7/1972 | Holmes, Jr. |
| 4,179,593 A | | 12/1979 | Tsunefuji |
| 4,296,394 A | * | 10/1981 | Ragheb .................... H01H 5/02 200/404 |
| 4,300,026 A | | 11/1981 | Bull |
| 4,319,107 A | | 3/1982 | Haskins |
| 4,359,611 A | | 11/1982 | Haskins |
| 4,395,610 A | | 7/1983 | Downs et al. |
| 4,489,297 A | | 12/1984 | Haydon et al. |

(Continued)

*Primary Examiner* — Edwin A. Leon
*Assistant Examiner* — Iman Malakooti
(74) *Attorney, Agent, or Firm* — Dorsey & Whitney LLP

(57) ABSTRACT

Electronic devices having input structures that are operative to translate a relatively small travel of an input surface to a larger travel elsewhere. For example, force exerted on an input surface of an input body may cause a corresponding input body to move a first distance. An arm, lever mechanism, or the like may have an end or other portion that moves a second distance in response to the input body's motion. The second distance may be greater than the first; in some embodiments, the second distance may be an order of magnitude or more than the first distance. The travel may close or open a switch in response to the force exerted on the input surface.

19 Claims, 15 Drawing Sheets

(56) References Cited

U.S. PATENT DOCUMENTS

| | | | |
|---|---|---|---|
| 4,758,694 A | | 7/1988 | Burdick |
| 5,216,396 A | | 6/1993 | Stahly |
| 5,559,311 A | | 9/1996 | Gorbatoff |
| 5,692,044 A | | 11/1997 | Hughes et al. |
| 5,717,176 A | * | 2/1998 | Dahlstrom ............. H01H 13/64 |
| | | | 200/1 B |
| 5,813,520 A | | 9/1998 | Reier et al. |
| 5,969,309 A | | 10/1999 | Nishimura et al. |
| 6,040,748 A | | 3/2000 | Gueissaz |
| 6,469,602 B2 | | 10/2002 | Ruan et al. |
| 6,538,539 B1 | | 3/2003 | Lu |
| 6,642,459 B2 | | 11/2003 | Chou et al. |
| 6,759,933 B2 | | 7/2004 | Fallak |
| 6,849,817 B2 | | 2/2005 | Takata et al. |
| 6,965,087 B2 | | 11/2005 | Wolber et al. |
| 7,164,091 B2 | | 1/2007 | Lu |
| 7,264,170 B2 | | 9/2007 | Lee et al. |
| 7,532,096 B2 | | 5/2009 | Zindler |
| 8,284,003 B2 | | 10/2012 | Klossek et al. |
| 8,581,679 B2 | | 11/2013 | Min et al. |
| 8,604,372 B2 | | 12/2013 | Yang et al. |
| 8,853,574 B2 | | 10/2014 | Christophy et al. |
| 8,981,245 B2 | | 3/2015 | Dinh et al. |
| 9,177,738 B2 | * | 11/2015 | Park ................... H01H 13/7057 |
| 9,691,570 B1 | | 6/2017 | Dinh et al. |
| 9,953,775 B2 | * | 4/2018 | Kim ...................... H01H 13/86 |
| 2012/0075199 A1 | | 3/2012 | Hsieh |

\* cited by examiner

ELECTRONIC DEVICE HAVING TRAVEL-MAGNIFYING INPUT/OUTPUT STRUCTURE

CROSS-REFERENCE TO RELATED APPLICATIONS

This application is a nonprovisional patent application of and claims the benefit of U.S. Provisional Patent Application No. 62/429,708, filed Dec. 2, 2016 and titled "Electronic Device Having Travel-Magnifying Input/Output Structure," the disclosure of which is hereby incorporated herein by reference in its entirety.

FIELD

The described embodiments relate generally to input switches in an electronic device, particularly in applications with limited height and/or travel distances. More particularly, the present embodiments relate to a mechanical switch. In some embodiments, the switch is a travel-magnifying switch having an input body that travels a first, relatively small distance that is translated into a larger distance away from the input body.

BACKGROUND

Many electronic devices employ mechanical switches, such as collapsing dome switches, as input mechanisms. Mechanical switches are generally reliable and provide inherent haptic feedback, as a user can often feel the mechanism of the switch closing.

However, as electronic devices have become more space-constrained, mechanical switches have presented problems. Many mechanical switches need a minimum amount of space to operate. For example, a typical dome switch needs about 200 microns of travel for the dome to collapse and close the switch. This is especially problematic in very thin electronic devices.

Solid-state input structures may greatly reduce required space and particularly travel. Many solid-state buttons travel 10 microns or less when force is exerted thereon. Solid-state buttons can use force sensors to determine when the button is pressed, for example. The force sensor registers a change in capacitance, resistance, current, voltage, or other electrical value when the solid-state button moves or flexes, even though such motion may be very small.

Solid-state input structures tend to require much more power than classic mechanical input structures and also have relatively high latency. Further, solid-state input structures are relatively complex and expensive when compared to mechanical input structures. However, a mechanical switch configured to amplify and transfer input travel to another location may combine several advantages of traditional mechanical switches and solid-state input structures. For example, such a low-travel mechanical switch would provide the lower-cost and increased simplicity of a traditional mechanical switch with the low vertical switch profile typical in solid-state input structures.

SUMMARY

One embodiment described herein takes the form of an electronic device, comprising: a housing surrounding an internal volume and defining an opening; an input body within the opening, the input body configured to move a first distance in a first direction in response to a force input; a connector terminus disposed within the internal volume; and a flexible switch below the input body and comprising a distal end; wherein: in a first state, the distal end is separated from the connector terminus; in a second state, the distal end contacts the connector terminus; the distal end is configured to travel a second distance in a second direction as the input body moves, the second direction opposite the first direction; and the second distance is greater than the first distance.

Another embodiment takes the form of an electronic device, comprising: a housing; an input body connected to the housing and configured to move in response to an input; a flexible switch below the input body and comprising a distal end; and a connector terminus configured to electrically contact the distal end; wherein: the input body is configured to move a first distance; the flexible switch is configured to deform in response to the input body moving the first distance, thereby moving the distal end a second distance; and the second distance is greater than the first distance.

Still another embodiment may take the form of an electronic device, comprising: a housing defining an internal volume and an opening; an input body comprising an input surface, the input structure configured to move into the internal volume in response to a force input on the input surface; a flexible switch disposed below the input body and having a first, a second, and a third connector point, each of the first, second, and third connector points offset from the input body; and multiple connector termini disposed within the internal volume, each connector terminus of the multiple connector termini configured to form an electrical connection with one of the connector points; wherein: the input structure is configured to operate in a first state and a second state; no electrical connection is formed in the first state; and at least one electrical connection is formed in the second state.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
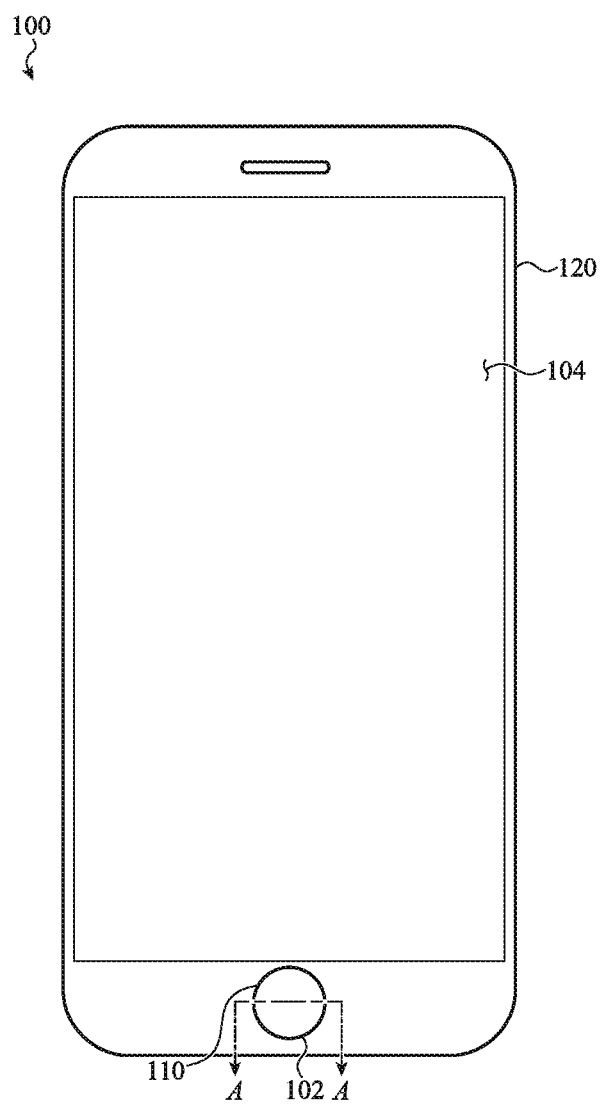
FIG. 1A illustrates a sample electronic device incorporating an input structure.

The use of cross-hatching in the figures is meant to indicate common elements in cross-section, and does not indicate any particular material forming those elements, or any color of those elements.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to electronic devices having input structures that are operative to translate a relatively small travel (for example, 10 microns) of an input surface to a larger travel (for example, 100 microns) elsewhere. For example, force exerted on an input surface of an input body may cause a corresponding input body to move a first distance. A flexible switch may take the form of an arm, lever mechanism, or the like (a "travel magnifier") below the input body and defining an end or other portion that moves a second distance in response to the input body's motion. The second distance may be greater than the first; in some embodiments, the second distance may be an order of magnitude or more than the first distance.

The travel magnifier (e.g., flexible switch) may close or open a switch in response to the force exerted on the input surface. In many embodiments, the switch is not aligned along an input axis with the input surface. The "input axis" is an axis along which a force is exerted on the input surface. In many cases, the input axis is perpendicular to the input surface, or to a portion of the input surface touched by the object exerting an input force. Put another way, the input body generally travels or otherwise translates along the input axis. A "perpendicular axis" is perpendicular to the input axis. Stated another way, the input body does not travel along the perpendicular axis. Typically, there are multiple perpendicular axes and one input axis; the input body generally travels only along the input axis (although this may vary in other embodiments). The switch, or some portion of the switch that completes an electrical contact (such as a distal end), displaces generally along the same axis as the input body but may move in an opposite direction.

The switch may be offset along one or more perpendicular axes, such as laterally in an X or Y direction (assuming the input body travels along the Z axis), from the input surface and/or input body. This permits a great degree of latitude in positioning the switch within an electronic device. In many electronic devices, space is highly constrained. This is especially true as devices become thinner; thinner devices have less space between a front and back of the device to stack or layer components. This reduction in thickness ("height") especially impacts mechanical switches, insofar as mechanical switches typically require a minimum travel distance to actuate.

Accordingly, offsetting the switch along a perpendicular axis from the input surface/input body, while maintaining a mechanical linkage between the two, permits use of a travel-magnifying input structure with a mechanical switch that utilizes relatively greater travel to operate. The mechanical switch may likewise be positioned in a portion of the electronic device that is not otherwise occupied by internal components, thereby providing additional flexibility in the layout of the electronic device.

Further, in the case of low-travel input mechanisms, switch contacts may not be sufficiently separated from one another to avoid electrical arcing when the input mechanism is in its rest state. For example, if an input body travels along the input axis in order to close a switch directly below the input body, then the distance between the switch contacts in the absence of an input force is the travel distance of the input body. If this distance is small (for example 5-50 microns or so), then electricity may arc between the contacts even when they are not touching, thus generating false input signals. Accordingly, a travel-magnifying input structure may separate electrical contacts by a distance that is greater than the travel distance of the input body, thereby reducing the likelihood of a false input.

As one example, locating a distal end or other portion of the switch laterally from the input surface/body may provide space to integrate modules that provide other functionality to the input body and its surface. For example, the input surface may relay a haptic output to a user touching the surface; a haptic module may generate the haptic output. Likewise, a biometric sensor (such as a fingerprint sensor) may be incorporated into the input structure or placed below the input structure, thereby obtaining a biometric input from a user touching the input surface. Insofar as the switch is not positioned below the input surface, the size and/or operation of the switch does not interfere with the size and/or operation of the biometric sensor. Sample biometric sensors may be capacitive, optical, or the like. Biometric sensors may be placed within the input body, within a protrusion abutting the input body, below switch members, and so on.

As another example, a switch may include more than one electrical contact point such that more than one contact point is required to activate and/or deactivate the switch. For example, a switch may have three electrical contact points such that the switch is activated when two or more electrical contacts are made. Such a switch may also be implemented to increase switch reliability or restrict undesirable fluctuations in a switch reading. For example, a switch with three electrical contact points may require that two or more electrical contact points be made to activate the switch but, once activated, may only require that one electrical contact point be made to keep the switch activated.

Some embodiments may employ both a haptic module and biometric sensor to provide enhanced functionality to the electronic device and, particularly, the input structure. Other embodiments may provide different and/or additional inputs and/or outputs via the input structure. For example, the input structure may be force-sensitive. That is, the input structure may be configured to provide an output that varies a force exerted thereon. The input structure may use a capacitive sensor, strain gage, or the like to output a force-varying signal. In such embodiments, the input structure may be affixed to a housing of the electronic device, and/or configured to flex or shift minimally with respect to the housing. Accordingly, the input structure may be a solid-state sensor, as one example. A solid-state input structure may move or deflect a small distance under a force (e.g., on the order of 50 microns or less, and 10 microns or less in some embodiments).

These and other embodiments are discussed below with reference to FIGS. 1-27. However, those skilled in the art will readily appreciate that the detailed description given herein with respect to these Figures is for explanatory purposes only and should not be construed as limiting.

Figure 1B:
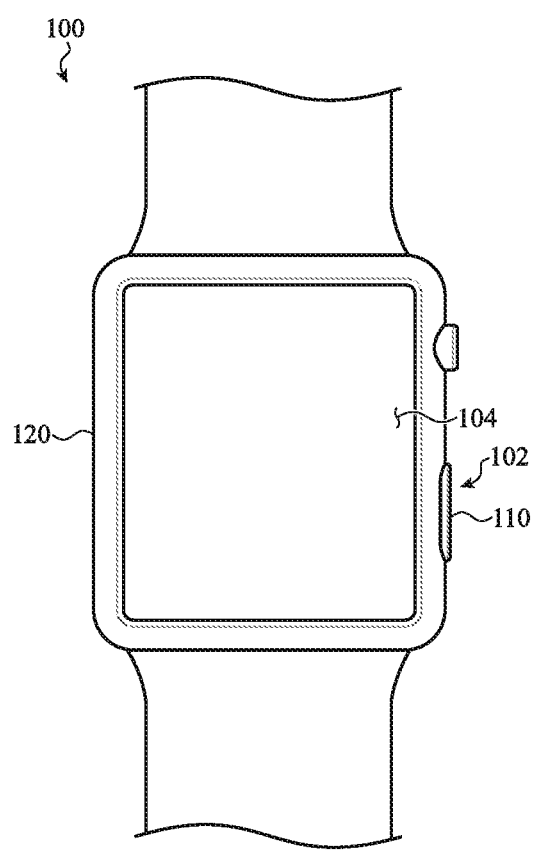
FIG. 1B illustrates a second sample electronic device incorporating an input structure.

FIGS. 1A-1B illustrate sample electronic devices 100 that may incorporate an input structure, as described herein. Although a mobile phone and watch are shown in FIGS. 1A-1B, it should be appreciated that any number of electronic devices may incorporate travel magnifying input structures, including (but not limited to): computers; personal digital assistants; media players; wearable devices; touch-sensitive devices; keypads; keyboards; and so on.

Generally, an input body includes an input surface 102 that may be touched, pressed, or otherwise interacted with by a user (only the input surface 102 of the input body is shown in FIG. 1A). In the embodiments of FIGS. 1A-B, the input structure is a button. The input surface 102 may translate, deflect, bend, or otherwise move a relatively small distance in response to user input. As one non-limiting example, the input surface 102 (and its corresponding input body, as discussed below) may move along the input axis approximately 50 microns or less (or, in some embodiments, approximately 10 microns or less than 10 microns) in response to user input.

The input surface 102 is set in an opening extending through a cover glass 104 of the electronic device 100. The cover glass 104 may form part of an exterior structure or housing 120 of the electronic device. The housing 120 may define, surround, or otherwise encompass an internal volume. The housing may further define an opening extending into the internal volume. In some embodiments, the internal volume may contain electronic and/or structural components of the electronic device 100, such as a processing unit, display, memory, battery, and the like.

The input body may translate into, or otherwise move into, the internal volume in response to a touch on the input surface 110. In some embodiments, a display is positioned below, and visible through, the cover glass 104. In certain embodiments, the input surface 110 may extend through a different portion of the housing, such as a sidewall, base, top piece other than the cover glass, and so on. The cover glass 104 may be omitted in certain electronic devices 100. In some embodiments, the input body may be fully beneath the cover glass 104 or housing 120; the cover glass 104/housing 120 may be locally flexible such that an input force exerted thereon is transmitted to the input body to initiate movement, as described elsewhere in this document.

Given the relatively small travel distance, a gasket, seal, or the like may prevent ingress of water, dust, and/or debris between the input surface 110 and the cover glass 104. In one embodiment, a seal is positioned along a perimeter edge below the input surface 102, such as along an edge of an input body which defines the input surface 102. Accordingly, components within the electronic device 100 may be shielded from external contaminants.

Figure 2:
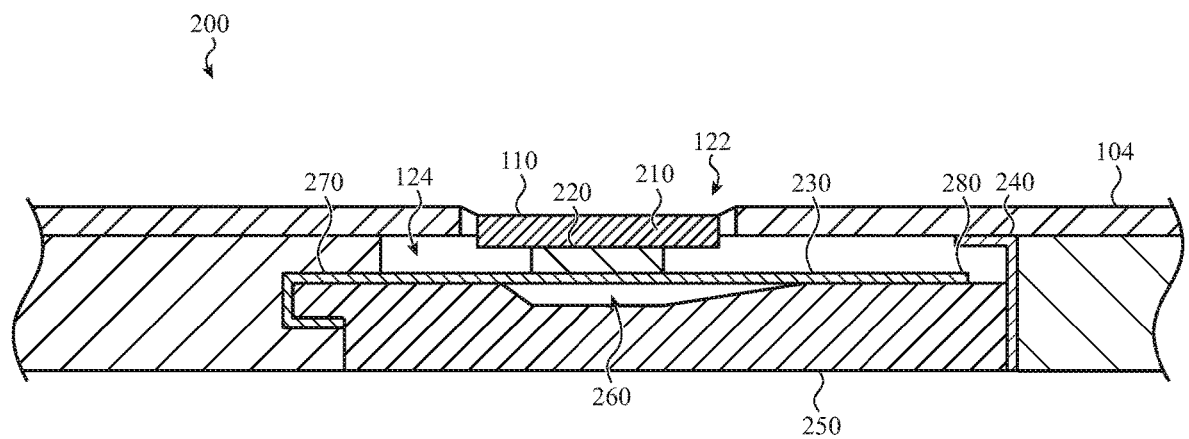
FIG. 2 is a cross-sectional view of a first example of an input structure, prior to receiving an input.
Figure 3:
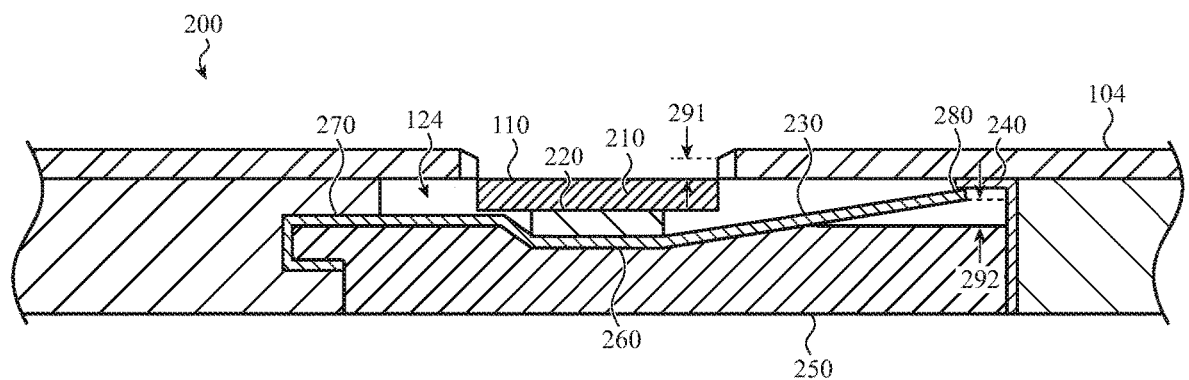
FIG. 3 is a cross-sectional view of the input structure of FIG. 2, after receiving an input.

FIGS. 2 and 3 are cross-sectional views taken along line A-A of FIG. 1A. FIGS. 2 and 3 illustrate an input structure 200 fitted to a housing 120 of an electronic device. The input structure 200 includes an input body 210 defining the input surface 110, a protrusion 220 extending from the input body 210, a flexible switch 230 below the input body, and a connector terminus 240. A lower surface of the protrusion 220 contacts or couples to the flexible switch 230 located below the input body. FIG. 2 depicts the flexible switch 230 in an unactuated or first state and FIG. 3 depicts the flexible switch 230 in an actuated or second state.

An internal support 250 of the electronic device is disposed or positioned below the flexible switch 230 and coupled to the housing. The internal support 250 defines a recess 260 below a portion of the flexible switch 230. The recess 260 is contained within the internal volume 124 of the electronic device. The recess 260 is located below a middle or medial portion of the flexible switch 230 positioned directly below the protrusion 220 and/or input body 210. The recess may be disposed below and/or within a projected vertical plane of the input body 210 (e.g., at least part of the recess is aligned with the input body along the input axis). The recess 260 may, in some embodiments, provide a fail-safe travel stop to restrict the travel of the protrusion 220 to a maximum set distance. In some embodiments, the input body 210 may translate along the input axis a maximum of 10 microns, such that the protrusion 220 and/or other parts of the input body 210 enter the recess, as may portions of the flexible switch 230.

The flexible switch 230 deforms into the recess 260 under force from the input body, but is generally straight in the absence of force exerted thereon. Accordingly, even though part of the flexible switch 230 overlies the recess 260 and is below the input body, the flexible switch 230 does not conform to the contour of the recess 260 when the input structure 200 and the flexible switch 230 are in a rest or first state. A first or proximal end 270 of the flexible switch 230 is fixed within the internal volume 124 of the electronic device. The proximal end 270 may be rigidly connected to at least a portion of the internal support 250. A second or distal end 280 of the flexible switch 230 is free to move or displace the internal volume 124 of the electronic device, typically along the same axis as the input body, and sometimes in an opposite direction. The internal support may have a flat base and an angled sidewall extending from the flat base at a non-zero, non-right angle. The combination of base and angled sidewall may define an obtuse angle in the recess (e.g., the recess may not be rectangular in cross-section). The flexible switch 230 may deform in order to lie flat against the base and the angled sidewall, such that the flexible switch 230 may extend at a non-zero, non-right angle towards its distal end 280. Put another way, when the input body is pressed, the flexible switch lies flat against, or otherwise conforms to, the base and angled sidewall of the recess such that a first portion of the flexible switch is flat against the base and a second portion of the flexible switch extends at an obtuse angle from the first portion to the distal end.

Comparing FIGS. 2 and 3, movement of the flexible switch 230 between a first state and a second state is depicted. Specifically, the input body 210 moves a first distance 291 along an input axis in response to a force input on the input surface 110, and the distal end 280 moves a second distance 292 along the input axis in response to a force input on the input surface 110. The distal end 280 displaces along the input axis but in an opposite direction to the motion of the input body. In the second state, the flexible switch 230 forms an electrical connection. The second distance 292 may be greater than the first distance 291. The second distance 292 is offset from the first distance 291. The depth of the cavity 260 and travel of the input body 210/protrusion 220 is exaggerated in FIG. 3 for clarity.

In response to a force input exerted on the input surface 110, the input body 210 and protrusion 220 translate downward or inward, along an input axis, toward the recess 260. As the input body 210 moves downward and, the protrusion 220 pushes a central or medial portion of the flexible switch 230 located below it into the recess 260, as shown in FIG. 3. Because the proximal end 270 of the flexible switch 230 is fixed or rigidly secured, the free or distal end 280 of the flexible switch 230 deflects upward (toward the connector terminus 240 and cover glass 104) and in an opposite direction to the travel of the input body/protrusion. Thus, the flexible switch 230 travels between a rest or a first state in which no or negligible force input is received by the input surface 110, to a second state in which a force input has been received. In the first state, the flexible switch 230 does not form an electrical connection within the internal volume 124. In the second state, the flexible switch 230 forms an electrical connection within the internal volume 124. Specifically, in the second state of the flexible switch 230, the distal end 280 forms an electrical connection with the connector terminus 240.

In one embodiment, upon an electrical contact between the flexible switch 230 and the connector terminus 240, a signal may be output to a processor of the electrical device that indicates a positive electrical connection. An electrical connection between the distal end 280 of the flexible switch 230 and the connector terminus 240 (the second state of the flexible switch 230) may indicate a switch-on configuration of the flexible switch 230. An absence of an electrical connection between the between the distal end 280 of the flexible switch 230 and the connector terminus 240 (the first state of the flexible switch 230) may indicate a switch-off configuration of the flexible switch 230. The connector terminus 240 may be disposed outside or beyond a projected vertical plane of the input body 210 (e.g., offset along a perpendicular axis from the input body, such that no portion of the input body is coplanar with the connector terminus when the input body is in a rest state).

The distal end 280 of the flexible switch 230 translates upward in response to downward motion of the protrusion 220 and/or input body 210. (It should be appreciated that the input body 210 may lack a protrusion in some embodiments and directly contact the flexible switch 230.) The distance traveled by the distal end 280 is greater than the distance traveled by the protrusion; the portion of the flexible switch 230 between the recess 260 and distal end 280 acts as a lever arm to amplify the (vertical) travel movement. Accordingly, the relatively small input body 210 travel causes the distal end 280 to close a much greater gap. When force is removed from the input surface 110, the input body 210 returns to the rest state shown in FIG. 2. In this rest state, the distal end 280 no longer contacts the connector terminus 240 and no input signal is generated.

In one embodiment, the second distance 292 is at least five times greater than the first distance 291. In one embodiment, the second distance 292 is at more than five times greater than the first distance 291. In one embodiment, the second distance 292 is at least ten times greater than the first distance 291. In one embodiment, the second distance 292 is at more than ten times greater than the first distance 291.

With attention to FIG. 3, the input body 210 is depicted at maximum travel, meaning that the input body 210 may no longer travel vertically (or inwards) within the opening 122 of the housing 120 of the electronic device (e.g., along an input axis). At the position of input body 210 maximum travel, a medial portion of the flexible switch 230 contacts an upper surface of the recess 260 and the distal end 280 contacts the connector terminus 240.

In some embodiments, the flexible switch 230 may contour to the sidewalls of the recess 260 when the protrusion 220 and input body 210 are at their maximum travel distance, as depicted in FIG. 3. In other embodiments, the flexible switch 230 may be deflected by a lip, wall, discontinuity or the like of the internal volume 124 but not contour itself to the internal volume 124.

The configuration of the recess 260 may affect the distance traveled by the distal end 280 of the flexible switch. For example, the angle of the distal wall of the recess 260 may vary the travel distance of the free end and the travel magnification of the input structure as a whole. Thus, by varying the shape, depth and other physical characteristics of the recess 260, the degree of travel magnification of the flexible switch 230 may be altered. Thus, the distal end 280 may be tuned to travel more or less as a function of the input body/protrusion's travel.

The distal end 280 may passively or naturally return to its rest state upon the removal of a force input to the input surface 110. That is, after the removal of the force input to input surface 110, the flexible switch 230 will return to the substantially flat state of FIG. 2. Such passive return of the distal end 280 to a rest state is similar to a leaf spring, wherein removal of an imparted force results in a return to a nominal state. In some embodiments, the return of the distal end 280 to a rest or nominal state is facilitated or augmented by a return member, such as a spring, connected between the distal end 280 and the internal support 250.

Figure 4:
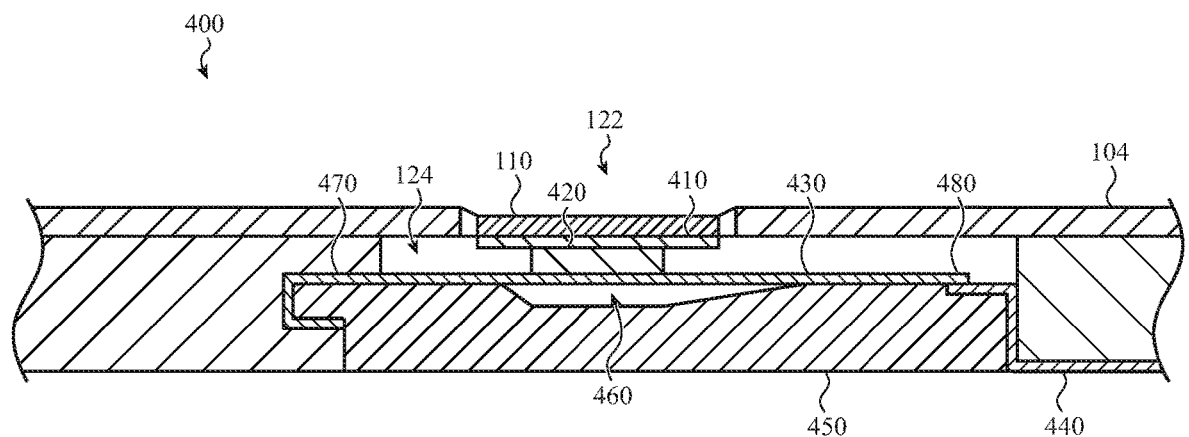
FIG. 4 is a cross-sectional view of another example of an input structure, prior to receiving an input.
Figure 5:
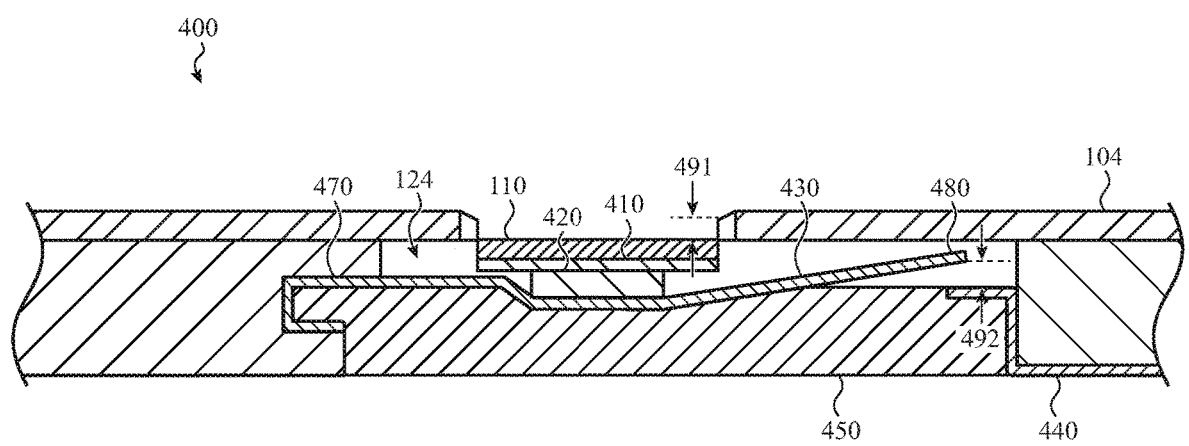
FIG. 5 is a cross-sectional view of the input structure of FIG. 4, after receiving an input.

FIGS. 4-5 illustrate a travel-magnifying input structure 400 similar to that of FIGS. 2-3. In the embodiment of FIGS. 4-5, however, when the flexible switch 430 is in a rest or first state (shown in FIG. 4), the distal end 480 of the flexible switch 430 is in contact with the connector terminus 440, thereby forming an electrical connection and forming a switch-on configuration. Stated another way, when force is exerted on the input surface 110, the input body 410 and protrusion 420 push part of the flexible switch 430 into the recess 460. Accordingly, the switch opens in response to an input force on the input surface. In contrast, in the embodiment of FIGS. 2-3, when the flexible switch 230 is in a rest or first state (shown in FIG. 2), no electrical contact is formed, forming a switch-off configuration.

FIGS. 4-5 are cross-sectional views taken along line A-A of FIG. 1A. An input structure 400 fitted to a housing 120 of an electronic device. The input structure 400 includes an input body 410 defining the input surface 110, a protrusion 420 extending from the input body 410, a flexible switch 430 below the input body 410, and a connector terminus 440. The protrusion 420 contacts or couples to the flexible switch 430 at a lower surface of the protrusion 420. FIG. 4 depicts the flexible switch 430 in an unactuated or first state and FIG. 5 depicts the flexible switch 430 in an actuated or second state.

Internal support 450 of the electronic device is disposed or positioned below the flexible switch 430 and may be coupled to the housing. The internal support 450 defines a recess 460 below a portion of the flexible switch 430. The recess 460 is contained within the internal volume 124 of the electronic device and is positioned below a middle portion of the flexible switch 430 below the protrusion 420 and/or input body 410. The recess may be disposed below and/or within a projected vertical plane of the input body 410.

The flexible switch 430 deforms under force, but is generally straight in the absence of force exerted thereon. A first or proximal end 470 of the flexible switch 430 is fixed within the internal volume 124 of the electronic device. The proximal end 470 may be rigidly connected to at least a portion of the internal support 450. A second or distal end 480 of the flexible switch 430 is free to move or move within the internal volume 124 of the electronic device.

Comparing FIGS. 4 and 5, movement of the flexible switch 430 between a first state and a second state is depicted. Specifically, the input body 410 moves a first distance 491 in response to a force input on the input surface 110, and the distal end 480 moves a second distance 492 in response to a force input on the input surface 110. In the first state, the flexible switch 430 forms an electrical connection. The second distance 492 may be greater than the first distance 491. The second distance 492 is offset from the first distance 491. The motion of the input body 410 and distal end 480 are along the same input axis, but in opposite directions.

In response to a force input exerted on the input surface 110, the input body 410 and protrusion 420 translate downward or inward toward the recess 460. As the input body 410 moves downward and contacts the flexible switch 430 located below it, the protrusion 420 pushes a middle portion of the flexible switch 430 into the recess 460, as shown in FIG. 5. Because the proximal end 470 of the flexible switch 430 is fixed or rigidly secured, the free or distal end 480 of the flexible switch 430 deflects upward (e.g., in a direction opposite the direction of motion of the input body). Thus, the flexible switch 430 travels between a rest or a first state in which no or negligible force input is received by the input surface 110, to a second state in which a force input has been received. In the first state, the flexible switch 430 forms an electrical connection within the internal volume 124. In the second state, the flexible switch 430 does not form an electrical connection within the internal volume 124. Specifically, in the first state of the flexible switch 430, the distal end 480 forms an electrical connection with the connector terminus 440 and, upon sufficient force input to the input surface 110, the flexible switch 430 actuates such that the electrical connection is broken and the switch moves from a switch-on to a switch-off position. When force input is removed from the input surface 110, the input body 410 returns to the rest state shown in FIG. 4. When the input body 410 is in this rest state, the distal end 480 likewise returns to a rest or neutral state in which an electrical connection is made between the distal end 480 and the connector terminus 440.

An electrical connection, and/or a change in an electrical connection, may generate a signal to a processor of the electrical device that indicates a positive electrical connection. For example, the opening of the flexible switch 430 may generate, or be interpreted as, an input signal by the electronic device. Thus, it should be appreciated that the travel-magnifying input structure 400 may either open or close a switch, and such opening and/or closing may provide an input signal.

Figure 6:
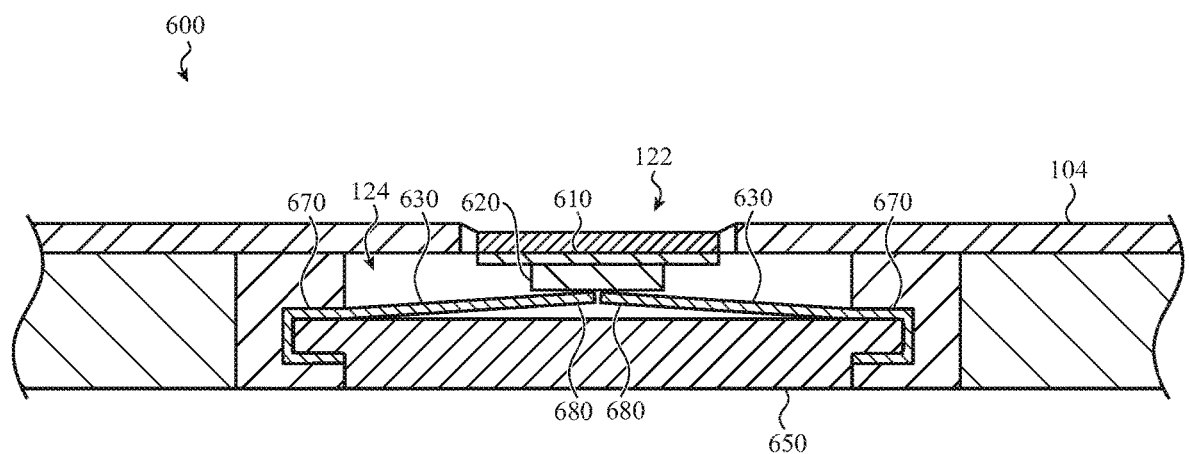
FIG. 6 is a cross-sectional view of an input structure, prior to receiving an input.
Figure 7:
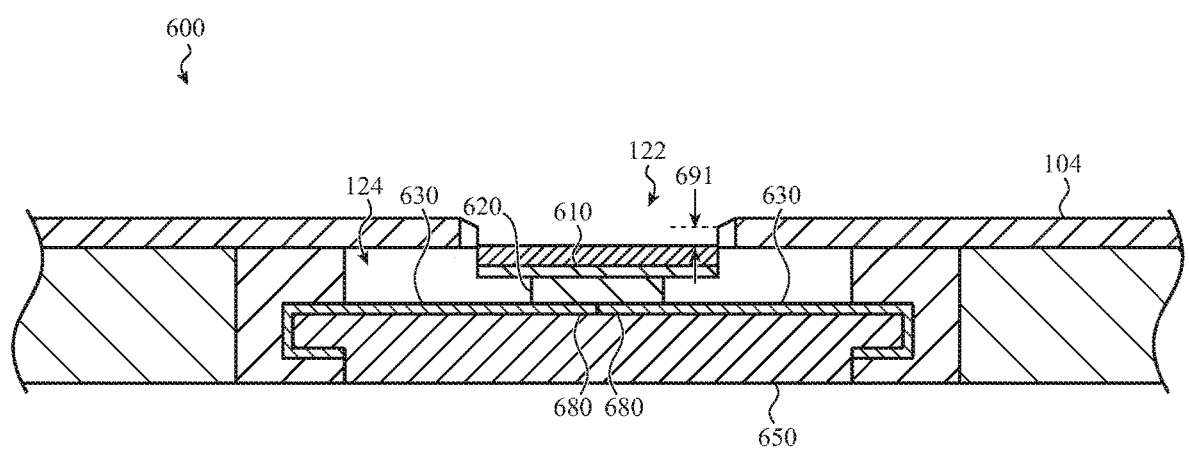
FIG. 7 is a cross-sectional view of the input structure of FIG. 6, after receiving an input.

FIGS. 6 and 7 depict an embodiment of an input structure 600 with a flexible switch 630 located below it. The flexible switch 630 is shown in a first state and a second state, respectively in FIGS. 6 and 7. This variant differs from those shown in FIGS. 2-5 insofar as the input structure 600 lacks a recess within the opening 122 of the housing 120 of an electronic device, and a pair of components of the flexible switch 630 are moveable rather than just one component. More specifically, the flexible switch 630 includes a pair of distal ends 680 and a companion pair of proximal ends 670. The flexible switch 630 is disposed below a protrusion 620 attached to the input body 610. Also, unlike some other input structures described herein, the input structure 600 does not necessarily magnify a travel of its input body 610 or protrusion 620.

Each of the pair of distal ends 680 translate downward in response to a force input applied to the input surface 110. When the input body 610 and/or protrusion 620 are depressed (in one embodiment, have translated their maximum distance), the pair of distal ends 680 flex inward and down, such that the pair touch or contact one another (as depicted in FIG. 7.) When the pair of distal ends 680 contact, an electrical circuit is completed such that the flexible switch 630 is in a second state (a switch-on state.)

In the embodiment of FIGS. 6-7, when the flexible switch 630 is in a rest or first state (shown in FIG. 6), the distal ends 680 of the flexible switch 630 are not in contact with one another, thereby not forming an electrical connection and presenting a switch-off configuration. When sufficient force input is exerted on the input surface 110, the input body 610 and protrusion 620 push the pair of distal ends 480 together and the switch is closed. In contrast, in the embodiment of FIGS. 4-5, when the flexible switch 430 is in a rest or first state (shown in FIG. 4), an electrical contact is formed, thereby presenting a switch-on configuration.

Internal support 650 of the electronic device is disposed or positioned below the flexible switch 630 and may be coupled to the housing. The internal support 650 defines a flat or planar surface below a portion of the flexible switch 630.

The flexible switch 630 actuates under force exerted thereon by the input body. Each of the pair of proximal ends 670 of the flexible switch 630 are fixed within the internal volume 124 of the electronic device. The proximal end 670 may be rigidly connected to at least a portion of the internal support 650. As described, each of the pair of distal ends 680 of the flexible switch 630 are free to move or move within the internal volume 124 of the electronic device.

Comparing FIGS. 6 and 7, movement of the flexible switch 630 between a first state and a second state is depicted. Specifically, the input body 610 moves a first distance 691 in response to a force input on the input surface 110, and each of the distal ends 480 move (vertically, or inwardly from outside the opening 122 to into the opening 122) the same first distance 691. In the first state (in which no or minimal force input is imparted to the input surface 110), the flexible switch 630 does not form an electrical connection. In the second state (in which a sufficient force input is imparted to the input surface 110), the flexible switch 630 does form an electrical connection. When the flexible switch 630 forms an electrical connection, the input structure 600 and/or the flexible switch 630 are deemed in a switch-on configuration or switch-on state. When the flexible switch 630 fails to form an electrical connection, the input structure 600 and/or the flexible switch 630 are deemed in a switch-off configuration or switch-off state.

When force input is removed from the input surface 110, the input body 610 returns to the rest state shown in FIG. 6. When the input body 610 is in this rest state, the pair of distal ends 680 returns to a rest or neutral state in which an electrical connection is not formed between the pair of distal ends 680. An electrical connection, and/or a change in an electrical connection, may generate a signal to a processor of the electrical device that indicates a positive electrical connection. For example, the closing of the flexible switch 630 may generate, or be interpreted as, an input signal by the electronic device.

Figure 8:
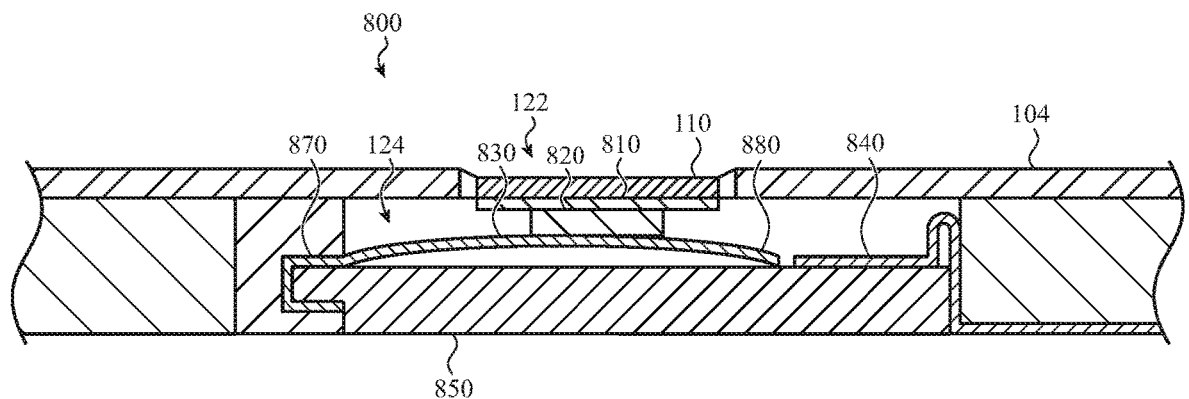
FIG. 8 is a cross-sectional view of another example of an input structure, prior to receiving an input.
Figure 9:
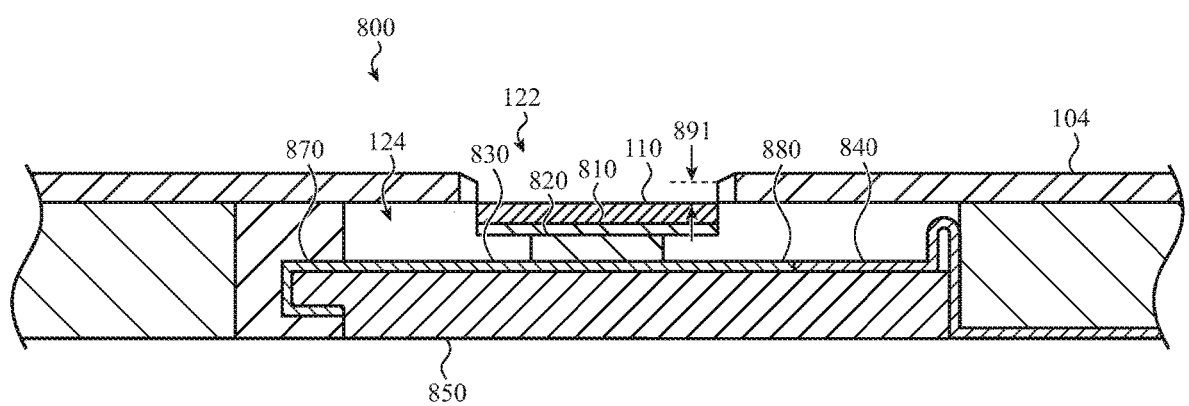
FIG. 9 is a cross-sectional view of the input structure of FIG. 8, after receiving an input.

FIGS. 8 and 9 depict an embodiment of an input structure 800 with a flexible switch 830 in a first state and a second state, respectively. This embodiment differs from those shown in earlier embodiments insofar as the input structure 800 includes a flexible switch 830 that is curved in a resting or nominal state. The input structure 800 includes an input body 810, a protrusion 820, a flexible switch 830, and a connector terminus 840 supported by an internal support 850. The flexible switch 830 is normally open when no force is exerted on the input surface 110 (e.g., the input structure 800 is in a rest state as shown in FIG. 8). Similar to the embodiment of FIGS. 6-7, the embodiment of FIGS. 8-9 does not include a recess formed in the internal volume 124 of the electronic device. As with prior embodiments, at least a portion of the input body 810 and/or protrusion 820 extends into an opening 122 within the housing.

In the embodiment of FIGS. 8-9, when the flexible switch 830 is in a rest or first state (shown in FIG. 8), the distal end 880 of the flexible switch 830 is not in in contact with the connector terminus 840, thereby forming a switch-off configuration. When a force input is exerted on the input surface 110, the input body 810 and protrusion 820 push part of the flexible switch 830 downward and toward a flat surface of the internal support 850 such that the flexible switch lies flat against the internal support, ultimately connecting the distal end 880 with the connector terminus 840. Accordingly, the switch closes in response to an input force on the input surface 110.

FIGS. 8-9 are cross-sectional views taken along line A-A of FIG. 1A. The input structure 800 is fitted to a housing 120 of an electronic device. The input structure 800 includes an input body 810 defining the input surface 110, a protrusion 820 extending from the input body 810, a flexible switch 830 located below the input body, and a connector terminus 840. The protrusion 820 contacts or couples to the flexible switch 830 at a lower surface of the protrusion 820. FIG. 8 depicts the flexible switch 830 in an unactuated or first state and FIG. 9 depicts the flexible switch 830 in an actuated or second state.

The flexible switch 830 is curved. As the input body 810 and protrusion 820 travel downward, a force is exerted on an upper surface of the flexible switch 830. The flexible switch 830 straightens in response to that force, thereby moving the distal end 880 toward the connector terminus 840. When the input body 810 and protrusion 820 have moved their maximum distance, the flexible switch 830 is generally straight and pressed against the internal support 850 by the protrusion 820. Further, the distal end 880 of the flexible switch 830 contacts the connector terminus 840, thereby creating an electrical connection between the two members (thus closing a switch).

The proximal end 870 of the flexible switch 830 is fixed within the internal volume 124 of the electronic device. The proximal end 870 may be rigidly connected to at least a portion of the internal support 850. A second or distal end 880 of the flexible switch 830 is free to move or move within the internal volume 124 of the electronic device. Internal support 850 of the electronic device is disposed or positioned below the flexible switch 830. The internal support 850 includes a generally planar or flat upper surface that is fitted to engage a lower surface of the flexible switch 830.

In response to a force input exerted on the input surface 110, the input body 810 and protrusion 420 translate downward or inward toward the upper surface of the internal support 850. As the input body 810 moves downward, the protrusion 820 pushes a middle portion of the flexible switch 830, such that the distal end 880 contacts the connector terminus 840, as shown in FIG. 9. Because the proximal end 870 of the flexible switch 830 is fixed or rigidly secured, the free or distal end 880 of the flexible switch 830 deflects upward, or otherwise in a direction opposite a direction of motion of the input body 810. Thus, the flexible switch 830 travels between a rest or a first state in which no or negligible force input is received by the input surface 110, to a second state in which a force input has been received. In the first state, the flexible switch 830 does not form an electrical connection within the internal volume 124. In the second state, the flexible switch 830 does form an electrical connection within the internal volume 124. Specifically, in the first state of the flexible switch 830, the distal end 880 does not form an electrical connection with the connector terminus 840 and, upon sufficient force input to the input surface 110, the flexible switch 830 actuates such that the electrical connection is broken and the switch moves from a switch-on to a switch-off position. When force input is removed from the input surface 110, the input structure 800 returns to the rest state shown in FIG. 8. In this rest state, the distal end 880 returns to a rest or neutral state in which no electrical connection is made between the distal end 880 and the connector terminus 840. An electrical connection, and/or a change in an electrical connection, may generate a signal to a processor of the electrical device that indicates a positive electrical connection.

Figure 10:
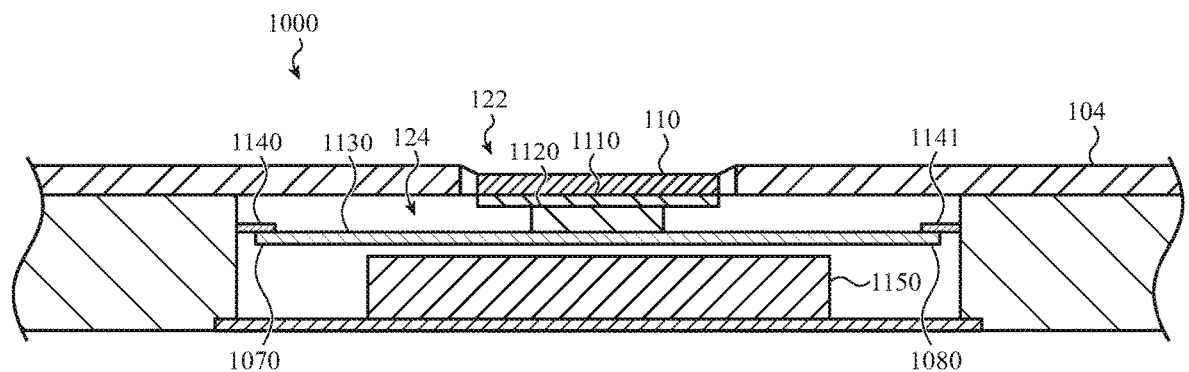
FIG. 10 is a cross-sectional view of another example of an input structure, prior to receiving an input.
Figure 11:
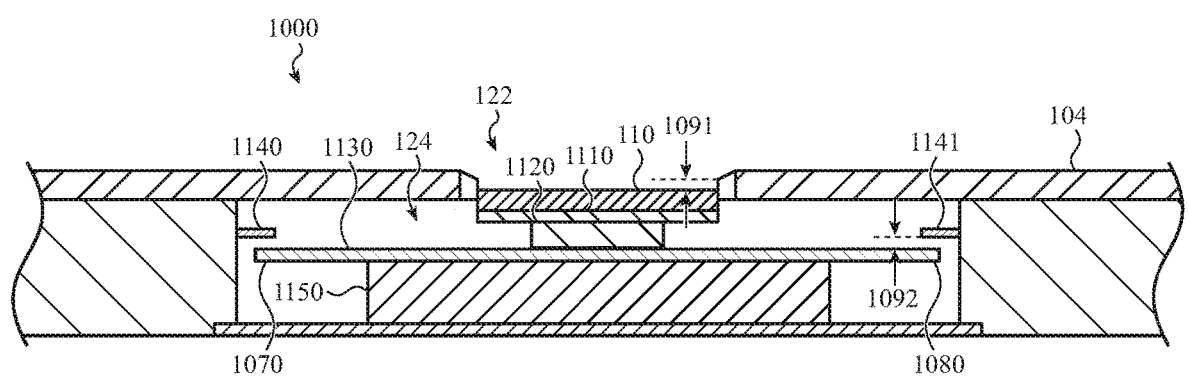
FIG. 11 is a cross-sectional view of the input structure of FIG. 10, after receiving an input.

FIGS. 10 and 11 illustrate yet another input structure 1000 with a flexible switch 1130 in a first state and a second state, respectively. Unlike many of the previous input structures described herein, the input structure 1000 does not necessarily magnify a travel of its input body 1110 or protrusion 1120. The input structure 1000 includes a pair of connector termini that may contact a pair of ends of the flexible switch 1130. The input structure 1000 is nominally in a switch-on state. The input structure 1000 includes an input body 1010 defining the input surface 110, a protrusion 1020 extending from the input body 1010, and a flexible switch 1030 located below the input body.

Each of the proximal end 1070 and distal end 1080 of the flexible switch 1130 translate downward in response to a force input applied to the input surface 110. When the input body 1010 and/or protrusion 1020 are depressed (in one embodiment, have translated their maximum distance), the proximal end 1070 and distal end 1080 move downward, such that one or both of the proximal end 1070 and the distal end 1080 contact first connector terminus and second connector terminus 1141, respectively (as depicted in FIG. 11.) When one or both of such connections are made, an electrical circuit is completed such that the flexible switch 1030 is in a second state (a switch-off state.)

In the embodiment of FIGS. 10-11, when the flexible switch 1030 is in a rest or first state (shown in FIG. 10), the proximal end 1070 is in contact with the first connector terminus 1040, and the distal end 1080 is in contact with the second connector terminus 1141, thereby forming an electrical connection and presenting a switch-on configuration. When sufficient force input is exerted on the input surface 110, the input body 1010 and protrusion 1020 push the two ends of the flexible switch 1030 downward and the connection to the connector termini is lost, thereby opening the switch.

The flexible switch 1030 is connected to a lower surface of the protrusion 1120. Internal support 1050 of the electronic device is disposed or positioned below the flexible switch 1030. The internal support 1050 defines a flat or planar surface below a portion of the flexible switch 1030. In the first or nominal state of the flexible switch 1030, a gap exists between the lower surface of the flexible switch 1030 and the upper surface of the internal support 1050. It should be appreciated that the internal support 1050 may be flexible or otherwise deform under force exerted by the input body 1110 and/or protrusion 1120, and return to an undeformed state when the force is removed.

Each of the pair of connector termini are fixed within the internal volume 124 of the electronic device. More specifically, first connector terminus 1140 is rigidly positioned within the internal volume 124, for example, to an edge surface of the internal volume 124. Also, second connector terminus 1141 is rigidly positioned within the internal volume 124, for example, to an edge surface of the internal volume 124.

Comparing FIGS. 10 and 11, movement of the flexible switch 1030 between a first state and a second state is depicted. Specifically, the input body 1010 moves a first distance 1091 in response to a force input on the input surface 110, and each of proximal end 1040 and distal end 1041 move vertically downward a second distance 1092. In this embodiment, first distance 1091 and second distance 1092 are substantially equal. In the first state (in which no or minimal force input is imparted to the input surface 110), the flexible switch 1030 forms an electrical connection. In the second state (in which a sufficient force input is imparted to the input surface 110), the flexible switch 1030 does not form an electrical connection.

When force input is removed from the input surface 110, the input structure 1000 returns to the rest state shown in FIG. 10. In this rest state, each of proximal end 1070 and distal end 1080 contact respective first connector terminus 1140 and second connector terminus 1141 in which an electrical connection is formed (a switch-on configuration.)

It is noted that insofar as the nominal state of the input structure 1000 is of a closed switch or switch-on configuration, even a momentary opening of the switch may generate an input signal. Accordingly, shorting of the contact termini 1140, 1141 is of less concern in this embodiment than in those in which the switch is nominally open.

Figure 12:
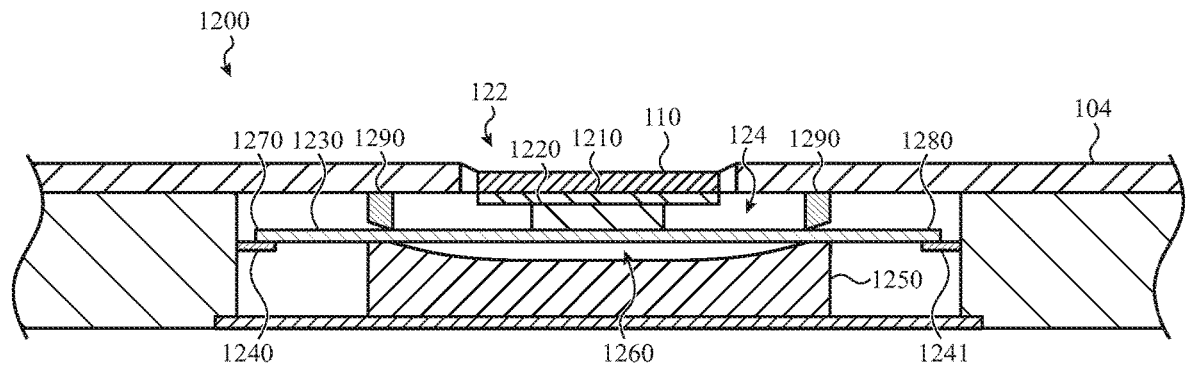
FIG. 12 is a cross-sectional view of another example of an input structure, prior to receiving an input.
Figure 13:
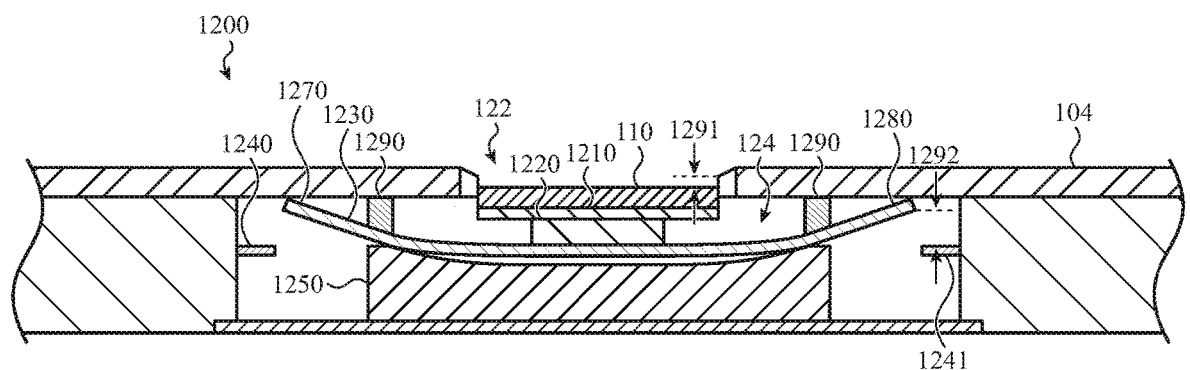
FIG. 13 is a cross-sectional view of the input structure of FIG. 12, after receiving an input.

FIGS. 12 and 13 illustrate another input structure 1200 with a flexible switch 1230 in a first state and a second state, respectively. As with prior embodiments, the travel-magnifying input structure 1200 includes an input body 1210 defining an input surface 110, a protrusion 1220 depending from the input body 1210, and a flexible switch 1230 below the input body. Similar to the embodiment of FIGS. 10-11, the switch member electrically connects two electrical contacts. The flexible switch 1230 of the input structure 1200 magnifies a travel of the input body 1210 or protrusion 1220. The input structure 1200 is nominally in an on state. The flexible switch 1230 deforms under force, but is generally straight in the absence of force exerted thereon (see FIG. 12.)

Internal support 1250 of the electronic device is disposed or positioned below the flexible switch 1230. The internal support 1250 defines a recess 1260 below a portion of the flexible switch 1230. The recess 1260 is contained within the internal volume 124 of the electronic device and is positioned below a middle portion of the flexible switch 1230 below the protrusion 1220 and/or input body 1210. The recess may be disposed below and at least within a projected vertical plane of the input body 1210. The flexible switch 1230 is connected to a lower surface of the protrusion 1220. Internal support 1050 of the electronic device is disposed or positioned below the flexible switch 1030.

Each of the proximal end 1270 and distal end 1280 of the flexible switch 1130 translate upward in response to a force input applied to the input surface 110. When the input body 1210 and/or protrusion 1220 are depressed (in one embodiment, have translated their maximum distance), the proximal end 1270 and distal end 1280 move upward, such that one or both of the proximal end 1270 and the distal end 1280 break contact with first connector terminus 1240 and second connector terminus 1241, respectively (as depicted in FIG. 13). Put another way, the proximal and distal ends 1270, 1280 move in directions opposite a direction of motion of the input body 1210. When one or both of such connections are broken, an electrical circuit is broken such that the flexible switch 1230 is in a second state (here, a switch-off state.) Note that the flexing each of the proximal end 1270 and distal end 1280 so as to flex upwards is facilitated by a pair of lever pins 1290, which acts as lever points.

In the embodiment of FIGS. 12-13, when the flexible switch 1230 is in a rest or first state (shown in FIG. 12), the proximal end 1270 is in contact with the first connector terminus 1240, and the distal end 1280 is in contact with the second connector terminus 1241, thereby forming an electrical connection and presenting a switch-on configuration. When sufficient force input is exerted on the input surface 110, the input body 1210 and protrusion 1220 push the two ends of the flexible switch 1230 upward and the connection to the connector termini is lost, thereby opening the switch.

Each of the pair of connector termini are fixed within the internal volume 124 of the electronic device. More specifically, first connector terminus 1240 is rigidly positioned within the internal volume 124, for example, to an edge surface of the internal volume 124. Also, second connector terminus 1241 is rigidly positioned within the internal volume 124, for example, to an edge surface of the internal volume 124.

Comparing FIGS. 12 and 13, movement of the flexible switch 1230 between a first state and a second state is depicted. Specifically, the input body 1210 moves downward a first distance 1291 in response to a force input on the input surface 110, and each of proximal end 1270 and distal end 1280 move vertically upward a second distance 1292, such that their directions of motion are opposite a direction of motion of the input body 1210. In this embodiment, second distance 1292 is greater than first distance 1291. In the first state (in which no or minimal force input is imparted to the input surface 110), the flexible switch 1230 forms an electrical connection. In the second state (in which a sufficient force input is imparted to the input surface 110), the flexible switch 1230 does not form an electrical connection.

When force input is removed from the input surface 110, the input structure 1200 returns to the rest state shown in FIG. 12.

Figure 14:
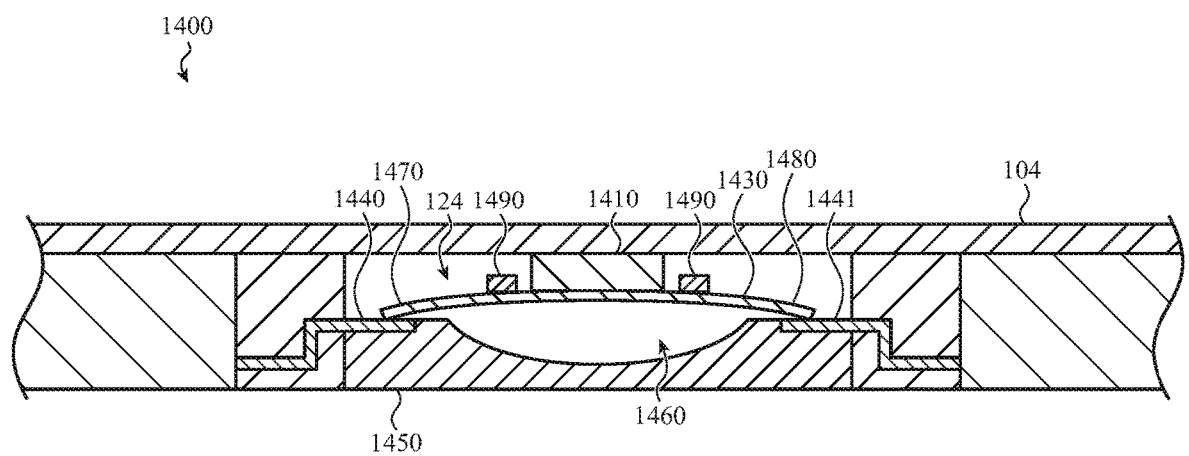
FIG. 14 is a cross-sectional view of another example of an input structure, prior to receiving an input.
Figure 15:
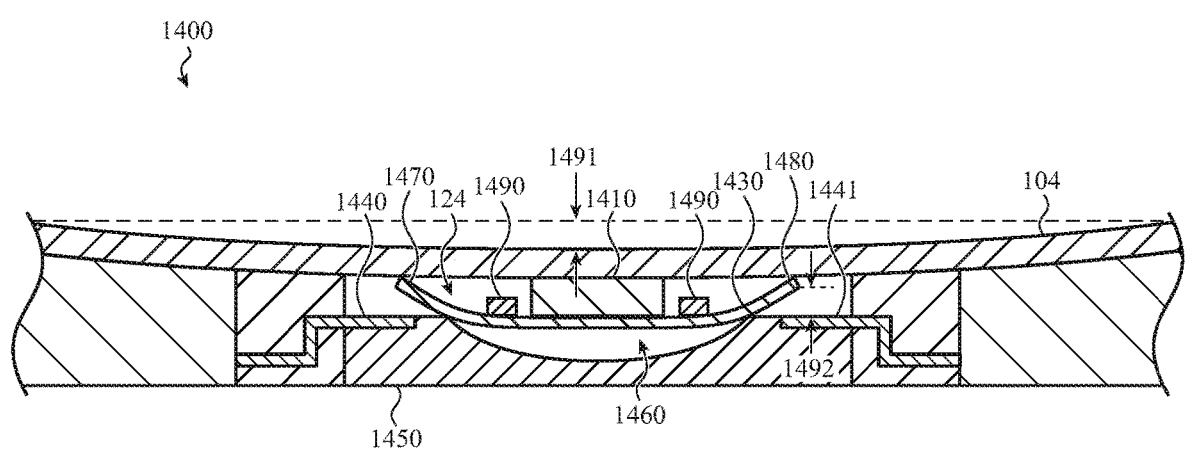
FIG. 15 is a cross-sectional view of the input structure of FIG. 14, after receiving an input.

FIGS. 14 and 15 illustrate another example of an input structure, in a first state and a second state, respectively. As with prior embodiments, the travel-magnifying input structure 1400 includes a flexible switch 1430. Similar to the embodiment of FIGS. 12 and 13, the switch member electrically connects two electrical contacts when the input structure 1400 is in a nominal or rest state, shown in FIG. 14. Accordingly, the switch formed by the electrical contacts and flexible switch is closed in a rest or first state.

In contrast to previous embodiments, the travel-magnifying input structure 1400 receives input by way of bending of the cover glass 104 (or, in other embodiments, a housing). When a user imparts a force input by pressing the cover glass 104, the cover glass slightly bends or bows, which imparts an input force to an input body 1410. At a given threshold level of input force, a corresponding threshold level of vertical movement of input body 1410 results, such that the flexible switch 1430 flips from a nominally upward curved shape (as shown in FIG. 14), to a downward curved shape (as shown in FIG. 15.) When the flexible switch 1430 is in the downward curved shape of FIG. 15, a central portion of the flexible switch 1430 descends into the recess 1460 and each of proximal end 1470 and distal end 1480 break contact with respective connector terminus 1440, 1441. Stated another way, upon sufficient force input to input body 1410, each of proximal end 1470 and distal end 1480 deflect upward such that electrical contact with respective first connector terminus 1440 and second connector terminus 1441 are broken (and the formerly closed switch is opened.)

Internal support 1450 of the electronic device is disposed or positioned below the flexible switch 1430. The internal support 1450 defines a recess 1460 below a portion of the flexible switch 1430. The recess 1460 is contained within the internal volume 124 of the electronic device and is positioned below a middle portion of the flexible switch 1430 below the input body 1410. An upper surface of the flexible connector is connected to a lower surface of the input body 1410.

Each of the pair of connector termini 1440, 1441 are fixed within the internal volume 124 of the electronic device. More specifically, first connector terminus 1440 is rigidly positioned within the internal volume 124, for example, inserted into an edge surface of the internal volume 124. Also, second connector terminus 1441 is rigidly positioned within the internal volume 124.

Comparing FIGS. 14 and 15, movement of the flexible switch 1430 between a first state and a second state is depicted. Specifically, the input body 1410 (as well as the cover glass 104) moves a first distance 1491 in response to a force input on the input surface 110, and each of proximal end 1470 and distal end 1480 move vertically upward a second distance 1492. In this embodiment, second distance 1492 is greater than first distance 1491. In the first state (in which no or minimal force input is imparted to the input surface 110), the flexible switch 1430 forms an electrical connection. In the second state (in which a sufficient force input is imparted to the input surface 110), the flexible switch 1430 does not form an electrical connection. When force input is removed from the input surface 110, the input structure 1400 returns to the rest state shown in FIG. 14.

The curved flexible switch 1430 is retained or secured by a cross brace 1490. The cross brace 1490 encircles input body 1410 and imparts a pre-load force to flexible switch 1430. In a first state of the travel-magnifying input structure 1400 (as shown in FIG. 14), cross brace 1490 imparts a nominal force to flexible switch 1430. The nominal force functions to retain the flexible switch 1430 in place. The flexible switch 1430 is disposed above internal support 1450 defining recess 1460.

As with other embodiments, the distance traveled by each of proximal end 1470 and distal end 1480 may be greater than the distance traveled by the input body 1410. For example, as provided in early embodiments, the second distance 1492 may be at least five, more than five, at least ten, and/or more than ten times greater than the first distance 1491. Further, and also similar to other embodiments, the location of the switch contact may be laterally moved from the location of the input body 1410.

Figure 16:
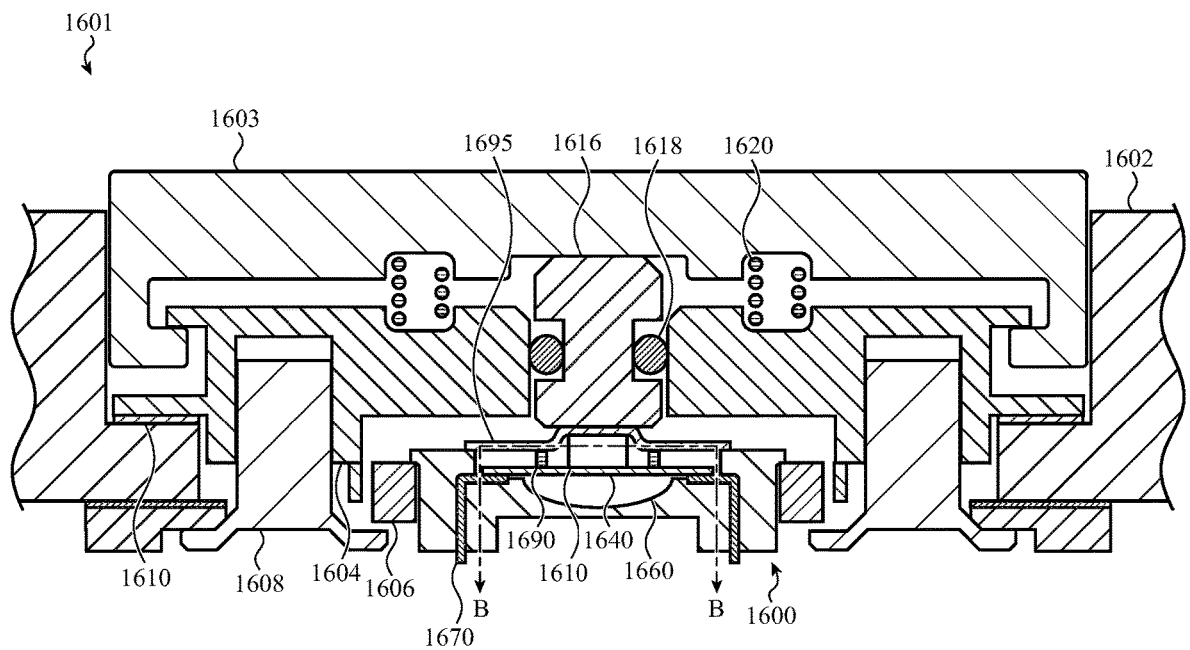
FIG. 16 is a cross-sectional view of an input structure adapted for use in a button-switch assembly.

FIG. 16 depicts a cross-section view of a button-switch assembly 1601 comprising an input structure 1600 adapted for use in a button-switch assembly 1601 of an electronic device 100. The travel-magnifying input structure 1600 is similar to that of FIGS. 14 and 15. However, in contrast to the embodiment of FIGS. 14 and 15, the travel-magnifying input structure 1600 is actuated by way of a push rod 1616 disposed below a button cap 1603. The button cap 1603 translates an input force to the travel-magnifying input structure 1600 by way of push rod 1616. Also, the flexible switch 1640 is substantially horizontally flat before receiving an input, rather than an upwardly curved shape. However, similar to the embodiment of FIGS. 14 and 15, the switch member electrically connects two electrical contacts 1670 when the travel-magnifying input structure 1600 is in its rest state, shown in FIG. 16. Accordingly, the switch formed by the electrical contacts and flexible switch is closed.

When a user presses the button cap 1603, the button cap 1603 descends downward within housing 1602 and in turn presses push rod 1616 downward. Push rod 1616 imparts a downward force to in nub 1610, which in turn presses flexible switch 1640. At a given threshold level of input force from nub 1610, the flexible switch 1640 flips from a nominally flat shape (as shown in FIG. 16), to a downward curved shape. When the flexible switch 1640 is in the downward curved shape, a central portion of the flexible switch 1640 descends into the recess 1660 and the free ends of flexible switch 1640 no longer form an electrical connection with the electrical contacts 1670. Thus, the switch circuit is broken and the switch opens.

Returning to the environment of the button-switch assembly 1601, button cap 1603 is disposed within a button aperture defined in the housing 1602. In some examples, the button cap 1603 can form a substantially continuous surface with the housing 1602. The button cap 1603 can be substantially flush with the external surface of the housing 1602. In some embodiments, the button cap 1603 can protrude from the housing 1602 such that an external surface of the button cap 1603 protrudes from the external surface of the housing 1602.

The button cap 1603 may comprise a button retainer 1604 and a bracket 1606. The button cap 1603 is retained at least partially in a counter bore of the housing 1602 by the button retainer 1604, and is biased away from the button retainer 1604 by one or more compressible biasing members 1620. Further, the button cap 1603 abuts or is adjacent to a first end of the push rod 1616, which may extend through the button retainer 1604. A second end of the push rod 1616 may abut or be disposed near the travel-magnifying input 1600, as described above. The travel-magnifying input structure 1600 may be affixed to the bracket 1606. One or more fasteners such as the screws 1608 may affix the bracket 1606 to the button retainer 1604 to clamp the button cap 1603 to the housing 1602 around a ledge of the housing 1602. A gasket seal 1610 may be positioned between an extension or underside of the button retainer 1604 and the ledge of a counter bore of the housing 1602. Seal 1618 may be positioned between paired extensions of the push rod 1616. The seal 1618 can be an annular seal (e.g., O-ring) that is sized to touch and/or compress against both the interior of the through-hole of the button retainer 1604 and the push rod 1616.

The push rod 1616 may couple the travel-magnifying input structure 1600 to the button cap 1603. The push rod 1616 may be disposed within a through-hole (e.g., aperture, hole, opening, and so on) of the button retainer 1604. The through-hole of the button retainer 1604 and the push rod 1616 may be formed so that the push rod 1616 can axially translate within the through-hole. More particularly, the push rod 1616 can move both upwardly and downwardly within the through-hole.

Bracket 1606 secures the travel-magnifying input structure 1600 relative to housing 1602. Bracket 1606 may be attached to button retainer 1604 by any of several means, e.g. by welding or adhesion. Sheet 1695 is disposed over nub 1610 and cross brace 1690, and may function to seal the travel-magnifying input structure 1600.

Figure 17:
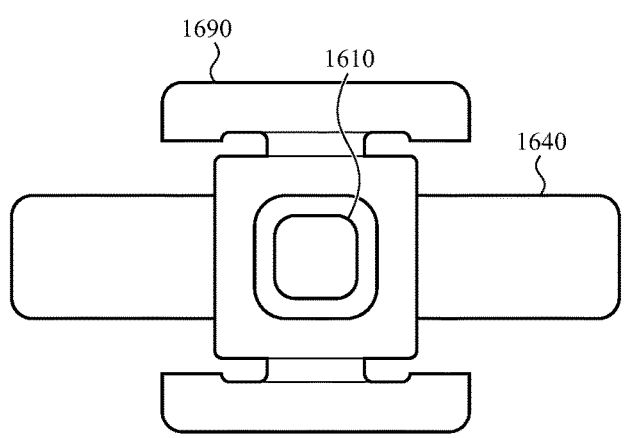
FIG. 17 is a top-view of the input structure of FIG. 16, taken along line B-B in FIG. 16 and showing one embodiment of a cross brace engaged with a flexible switch.

FIG. 17 is a top-view of the travel-magnifying input structure 1600 of FIG. 16, taken along line B-B in FIG. 16. Cross brace 1690 is configured to fit around an input surface 1610 of input structure 1600. Cross brace 1690 imparts a preload to flexible switch 1640 to bias the flexible switch 1640 away from recess 1660. The cross brace 1690 secures the flexible switch 1640 below the input body 1610 and above the recess 1660, and prevents lateral or longitudinal movement of the flexible switch 1640. Other configurations, e.g. geometries, of the cross brace 1690 are possible.

Figure 18:
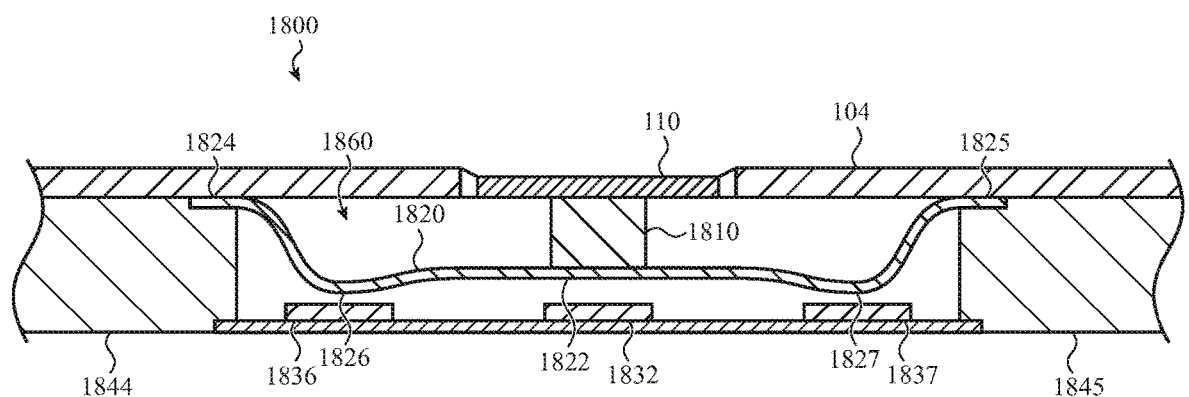
FIG. 18 is a cross-sectional view of another example of an input structure, prior to receiving an input.
Figure 19:
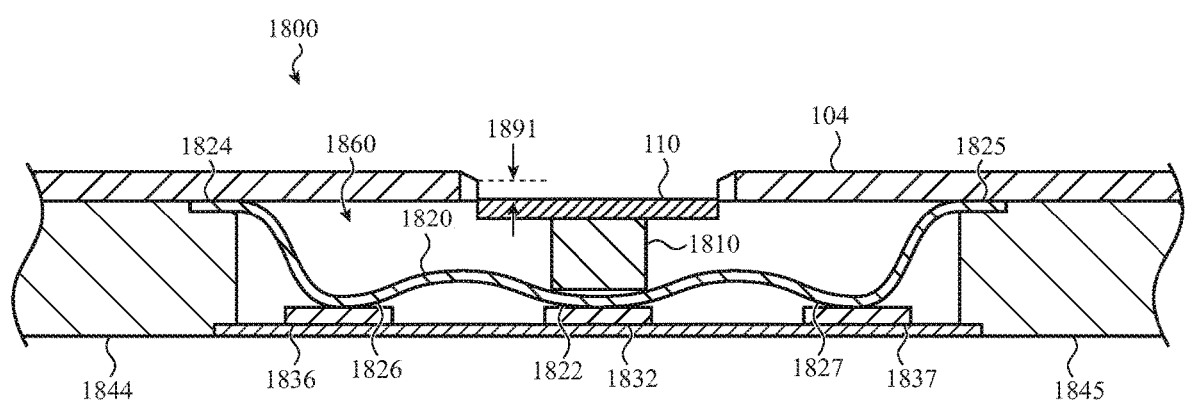
FIG. 19 is a cross-sectional view of the input structure of FIG. 18, after receiving an input.

FIGS. 18 and 19 illustrate another input structure 1800 with a flexible switch 1820 in a first state and a second state, respectively. Unlike many of the previous input structures described herein, the input structure 1800 does not necessarily magnify a travel of its input body 1810, but may provide improved robustness of electrical connections and/ or of switch operation. The input structure 1800 includes three connector termini that may contact one, two or three portions of the flexible switch 1820. The flexible switch 1820 is nominally in a switch-off state. The input structure 1800 includes an input body 1810 defining the input surface 110. The input body 1810 forms a top-hat geometry.

The flexible switch 1820 includes a proximal end 1824 and a distal end 1825. Each of the proximal end 1824 and a distal end 1825 are rigidly connected to a respective first cavity wall 1844 and second cavity wall 1845. The flexible switch 1820 is disposed within an internal volume 1860 of an electronic device. The flexible switch 1820 includes three connector points, each configured to form an electrical connection with connector termini disposed below a respective connector point.

A set of three connector termini are disposed on a bottom or lower surface of the internal volume 1860. Each of first connector terminus 1836, second connector terminus 1832, and third connector terminus 1837 are disposed on a bottom or lower surface of internal volume 1860.

Each of the three connector points is configured to form an electrical connection with connector termini disposed below a respective connector point. Specifically, the first connector point 1826 is configured to connect with first connector terminus 1836, the second connector point 1822 is configured to connect with second connector terminus 1832, and the third connector point 1827 is configured to connect with third connector terminus 1837.

When the flexible switch 1830 is in a rest or first state (shown in FIG. 18), none of the three connector points are connected with any of the respective connector termini. In the first state of the flexible switch, the switch is inactive or in a switch-off state. However, upon a sufficient force input to the input surface 110, the input body 110 moves downward a distance 1891, and each of the three connector points connects with a respective connector terminus. Stated another way, upon a sufficient input force to input surface 110, the first connector point 1826 connects with the first connector terminus 1836, the second connector point 1822 connects with the second connector terminus 1832, and the third connector point 1827 connects with the third connector terminus 1837. In this later configuration, the flexible switch 1820 is in a second state or a switch-on state. When force input is removed from the input surface 110, the input structure 1800 returns to the rest state shown in FIG. 18.

Figure 20:
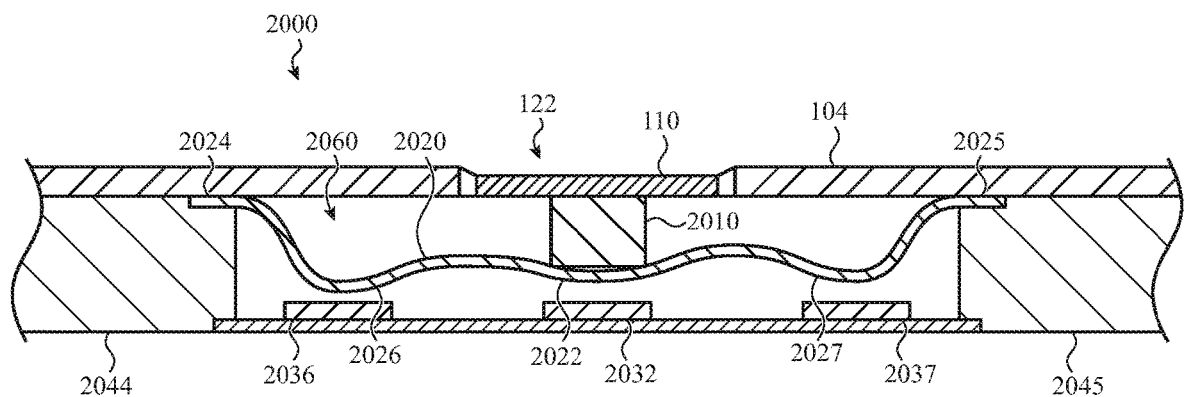
FIG. 20 is a cross-sectional view of another example of an input structure, prior to receiving an input.
Figure 21:
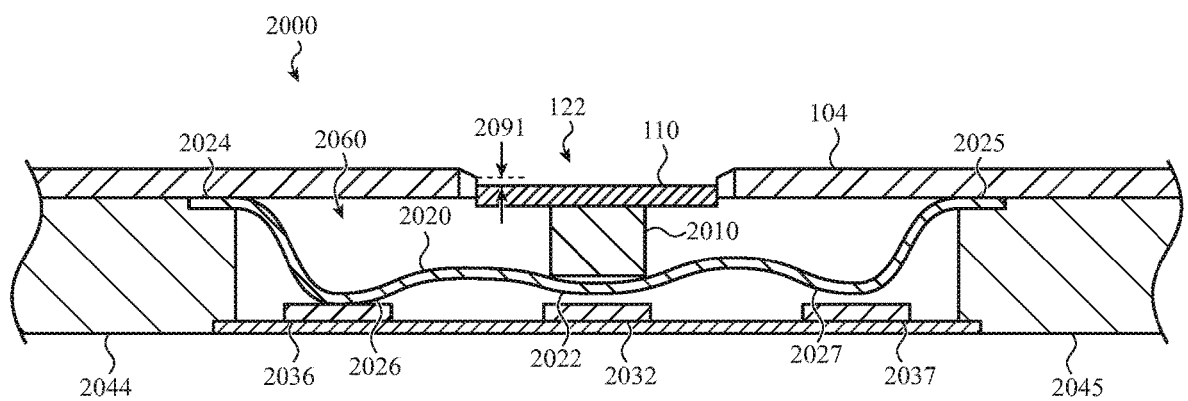
FIG. 21 is a cross-sectional view of input structure of FIG. 20, after receiving an input of a first magnitude.
Figure 22:
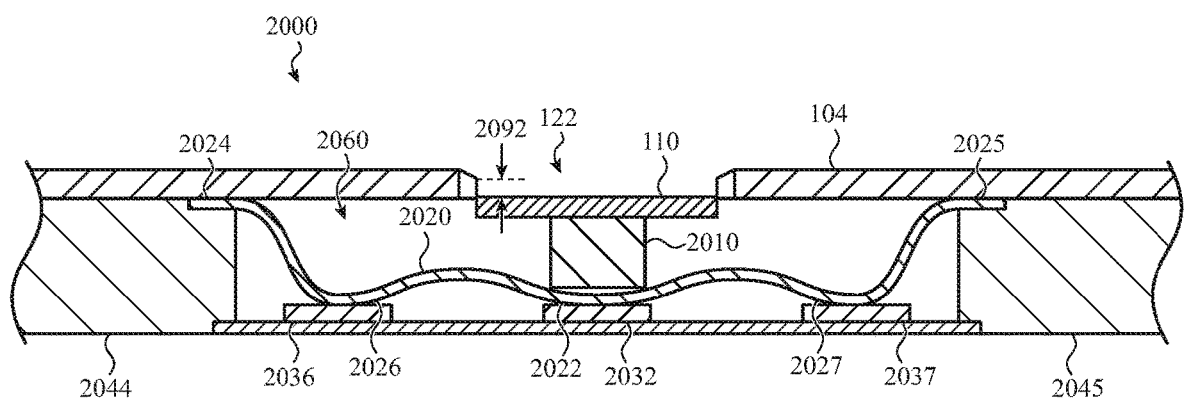
FIG. 22 is a cross-sectional view of the input structure of FIG. 20, after receiving an input of a second magnitude.

FIGS. 20-22 illustrate another input structure 2000 with a flexible switch 2020 in a first, second, and third state, respectively. Unlike many of the previous input structures described herein, the input structure 2000 does not necessarily magnify a travel of its input body 2010, but may provide improved robustness of electrical connections and/ or of switch operation. Also, the input structure 2000 provides a three-position switch, and may be configured to provide a switch with hysteresis, in that switch operation when a force is applied in a downward direction is different than switch operation in an upward direction. The input structure 2000 includes three connector termini that may contact one, two or three portions of the flexible switch 2020. The flexible switch 2020 is nominally in a switch-off state. The input structure 2000 includes an input body 2010 defining the input surface 110. The input body 2010 forms a top-hat geometry.

The flexible switch 2020 includes a proximal end 2024 and a distal end 2025. Each of the proximal end 2024 and a distal end 2025 are rigidly connected to a respective first cavity wall 2044 and second cavity wall 2045. The flexible switch 2020 is fitted within an internal volume 2060 of an electronic device. The flexible switch 2020 includes three connector points, each configured to form an electrical connection with a connector terminus disposed below a respective connector point. A set of three connector termini are disposed on a bottom or lower surface of the internal volume 2060. Each of first connector terminus 2036, second connector terminus 2032, and third connector terminus 2037 are disposed on a bottom or lower surface of internal volume 2060.

Similar to the embodiment of FIGS. 18-19, each of the three connector points is configured to form an electrical connection with a connector terminus disposed below a respective connector point. Specifically, the first connector point 2026 is configured to connect with first connector terminus 2036. The second connector point 2022 is configured to connect with second connector terminus 2032, and the third connector point 2027 is configured to connect with third connector terminus 2037.

When the flexible switch 2020 is in a rest or first state (shown in FIG. 20), none of the three connector points are connected with any of the respective connector termini. In the first state of the flexible switch, the switch is inactive or in a switch-off state.

Upon a force input of a first magnitude to the input surface 110, the input body 110 moves downward a distance 2091, and one of the three connector points connects with a respective connector terminus. Specifically, upon a force input of a first magnitude to input surface 110, the first connector point 2026 connects with the first connector terminus 2036, as depicted in FIG. 21. The configuration of FIG. 21, in which one of the three connector points connects with a respective connector terminus, may be considered a second state of the flexible switch 2020.

Upon a force input of a second magnitude (greater than the first magnitude) to the input surface 110, the input body 110 moves downward a distance 2092 that is greater than distance 2091, and all three connector points connect with a respective connector terminus. The configuration of FIG. 22, in which each of the three connector points connects with a respective connector terminus, may be considered a third state of the flexible switch 2020.

The three states of the flexible switch 2020 allow several operations, as controlled by a processor of the electronic device hosting the input structure 2000. For example, each of three states may be used to trigger features of the electronic device, such as three distinct user profile settings, three brightness levels for a display, and the like.

As briefly discussed, the input structure 2000 may be configured to provide a switch with hysteresis, in that switch operation when a force is applied in a downward direction is different than switch operation in an upward direction. For example, if a switch-on/switch-off switch is desired that is less sensitive to the release of applied force than the application of applied force, the flexible switch 2020 may trigger different operations by a processor of the electronic device depending on the directionality of the force input to the input surface 110. Specifically, if a downward (or increasing force) is applied to the input surface 110, the processor may trigger a switch-on status only once all three connections are made. However, if the applied force is decreasing from a configuration in which all three were made, the processor may not change the switch status from switch-on to switch-off until two (rather than just one) connection is lost. Thus, the input structure will provide a switch that is less sensitive to a decreasing applied force than an increasing applied force.

Figure 23:
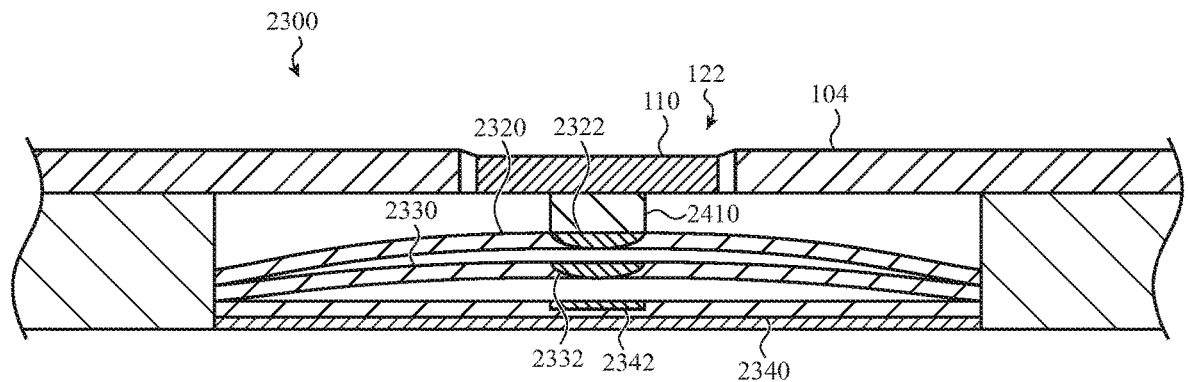
FIG. 23 is a cross-sectional view of another example of an input structure, prior to receiving an input.
Figure 24:
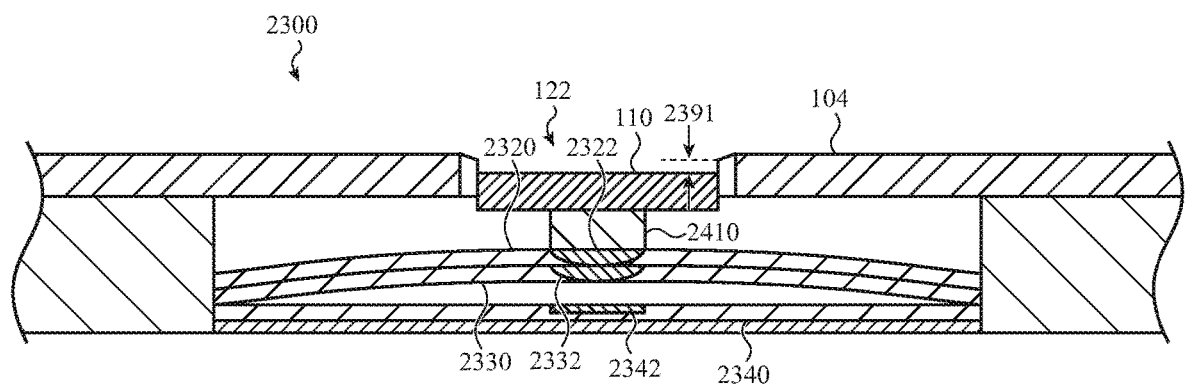
FIG. 24 is a cross-sectional view of the input structure of FIG. 23, after receiving an input of a first magnitude.
Figure 25:
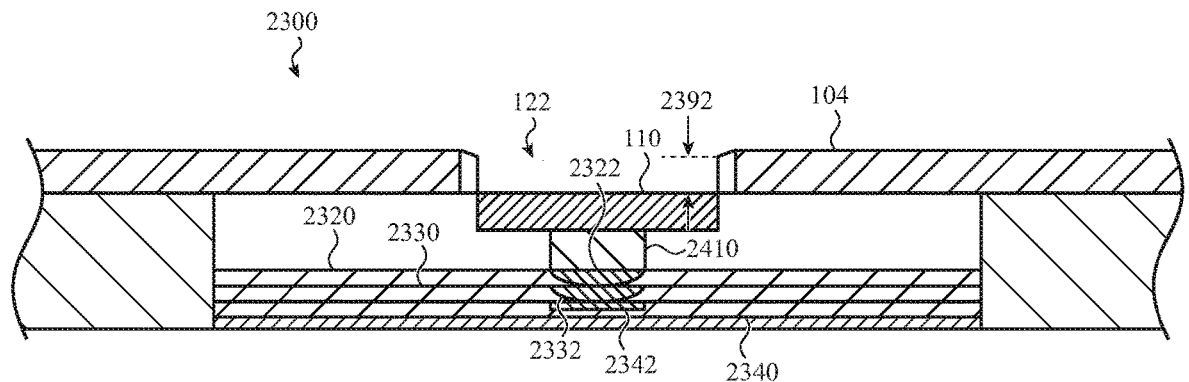
FIG. 25 is a cross-sectional view of the input structure of FIG. 23, after receiving an input of a second magnitude.

FIGS. 23-25 illustrate another input structure 2300 with flexible switches 2320, 2330, 2340 in a first, second, and third state, respectively. The input structure 2300 does not necessarily magnify a travel of its input body 2410, but may provide improved robustness of switch operations. The input structure 2300 provides a three-position switch, and may be configured to provide a switch with hysteresis, similar to the operations of the embodiment of FIGS. 21-22.

The input structure 2300 includes a set of three flexible switches 2320, 2330, 2340, each fitted with a connection point. First flexible switch 2320 includes a first connection point disposed at a lower surface of the input body 2410. Second flexible switch 2330 includes a second connection point 2332. Third flexible switch 2340 includes a second connection point 2342. The input structure 2300 is nominally in a switch-off state. The input structure 2300 includes an input body 2410 defining the input surface 110. The input body 2410 forms a top-hat geometry.

The three flexible switches 2320, 2330, 2340 cooperate to form three states of the input structure 2300. In state one, no connection is made between any of the connection points, as depicted in FIG. 23. In state two, the first connection point disposed at a lower surface of the input body 2410 is connected with the second connection point 2332, as depicted in FIG. 24. In state three, the first connection point disposed at a lower surface of the input body 2410 is connected with the second connection point 2332, and the second connection point 2332 is connected with the third connection point 2342, as depicted in FIG. 25.

The three states of the input structure 2300 are determined by the magnitude of force input to the input surface 110. When no or minimal force input is applied to the input surface 110, the input structure 2300 operates in a first state. Upon a force input of a first magnitude to the input surface 110, the input body 110 moves downward a first distance 2391, and a pair of connector points connects together. Specifically, upon a force input of a first magnitude to input surface 110, the first connection point disposed at a lower surface of the input body 2410 connects with the second connection point 2332, as depicted in FIG. 24. When a force input of a second magnitude (greater than the first magnitude) is provided to the input surface 110, the input body 110 moves downward a second distance 2392 that is greater than first distance 2391, and all three connector points connect, as depicted in FIG. 25.

The three states of the flexible switch 2320 allow several operations, as controlled by a processor of the electronic device hosting the input structure 2300. For example, each of three states may be used to trigger features of the electronic device, such as three distinct user profile settings, three brightness levels for a display, and the like, as discussed above with respect to the embodiment of FIGS. 21-22, to include providing a switch with hysteresis.

Figure 26:
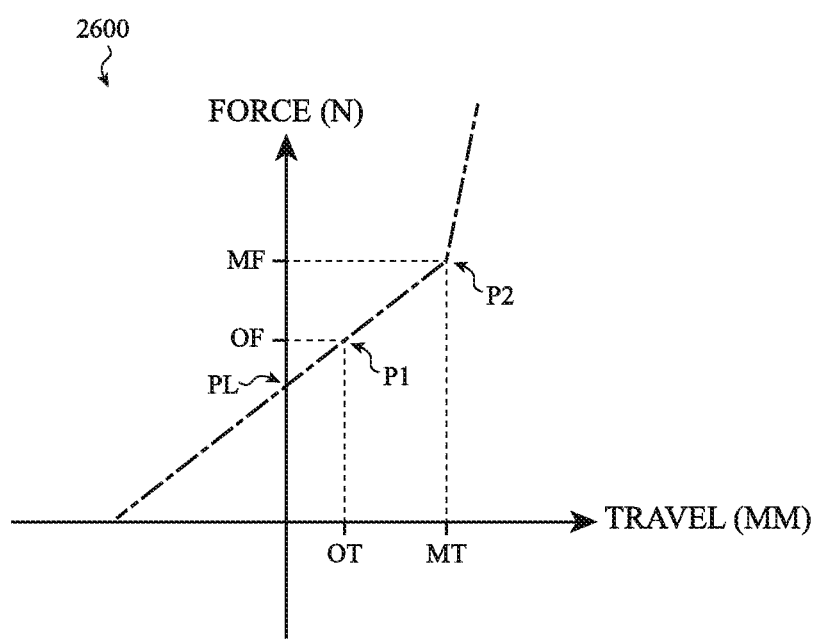
FIG. 26 illustrates an example travel-force graph of an input structure according to various embodiments.

FIG. 26 is an example graph illustrating a travel-force curve 2600 of a travel-magnifying input structure. As illustrated, a travel-magnifying input structure receives an input force which is translated to a movement or travel of the travel-magnifying input structure, such as an end of the flexible switch. The vertical movement of an end of the travel-magnifying switch member is plotted on the x-axis, and the input force, to the travel-magnifying input switch, is plotted on the y-axis. At a position of no travel, that is, at x-axis of 0, a positive force is held by or imparted to the travel-magnifying switch, identified at PL. With increasing input force, the switch travels to a position OT, corresponding to an input force OF, wherein the switch either breaks contact (e.g. the embodiment of FIGS. 14 and 15) or makes contact (e.g. the embodiment of FIGS. 2 and 3) with a conductive member to break or complete a circuit. Continued input force to the switch will result in a point where the flexible switch "bottoms out" and is structurally prevented from movement. This point is shown as point P2 of the travel-force curve 2600, at travel MT and input force MF.

Figure 27:
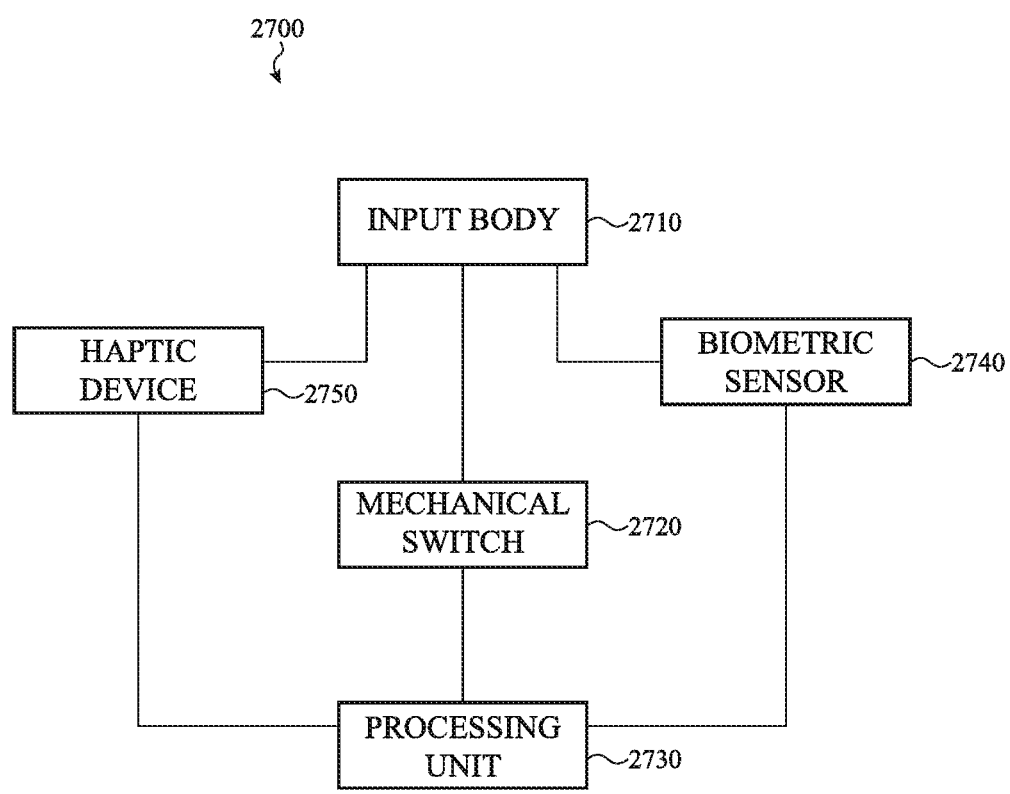
FIG. 27 is a sample block diagram of an input structure and associated electronic components.

FIG. 27 is a sample block diagram of an input structure and associated electronic components. The sample input structure 2700 typically includes the components mentioned above; an input body 2710 and mechanical switch 2720 are illustrated here for clarity. The mechanical switch 2720 may be formed by any combination of flexible switches, connector termini, electrical contacts, and/or supports as previously discussed.

As also previously discussed, motion of the input body 2710 may close (or, in some embodiments, open) the mechanical switch 2720, thereby generating an input signal received by a processing unit 2730. The processing unit, in turn may instruct a haptic device 2750 to provide a haptic output to the input body 2710. This haptic output may be perceived by a user touching the input body 2710, thereby confirming the user's input or providing other tactile feedback to the user.

The processing unit 2730 may also instruct a biometric sensor 2740 to capture a biometric datum from the user. Often, the biometric sensor is located below the input body and may sense the user's biometric datum through the input body. The biometric sensor may be a capacitive, ultrasonic, or optical fingerprint sensor, for example. The biometric sensor may capture other biometric data, such as pulse rate, vascular pattern, and so on instead of or in addition to a fingerprint. This data may be used to unlock an associated electronic device, provide access to certain functions of the electronic device, or initiate other inputs or outputs.

The haptic device 2750 and/or biometric sensor 2740 may be separate electrical components or may be packaged together with, and optionally as part of, the input structure 2700.

The present disclosure recognizes that personal information data, including biometric data, in the present technology, can be used to the benefit of users. For example, the use of biometric authentication data can be used for convenient access to device features without the use of passwords. In other examples, user biometric data is collected for providing users with feedback about their health or fitness levels. Further, other uses for personal information data, including biometric data, that benefit the user are also contemplated by the present disclosure.

The present disclosure further contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure, including the use of data encryption and security methods that meets or exceeds industry or government standards. For example, personal information from users should be collected for legitimate and reasonable uses of the entity and not shared or sold outside of those legitimate uses. Further, such collection should occur only after receiving the informed consent of the users. Additionally, such entities would take any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices.

Despite the foregoing, the present disclosure also contemplates embodiments in which users selectively block the use of, or access to, personal information data, including biometric data. That is, the present disclosure contemplates that hardware and/or software elements can be provided to prevent or block access to such personal information data. For example, in the case of biometric authentication methods, the present technology can be configured to allow users to optionally bypass biometric authentication steps by providing secure information such as passwords, personal identification numbers (PINS), touch gestures, or other authentication methods, alone or in combination, known to those of skill in the art. In another example, users can select to remove, disable, or restrict access to certain health-related applications collecting users' personal health or fitness data.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device, comprising:
   a housing surrounding an internal volume and defining an opening;
   an input body within the opening, the input body configured to move a first distance in a first direction in response to a force input;
   a connector terminus disposed within the internal volume; and
   a flexible switch below the input body and comprising a distal end; wherein:
      in a first state, the distal end is separated from the connector terminus;
      in a second state, the distal end contacts the connector terminus;
      the distal end is configured to travel a second distance in a second direction as the input body moves, the second direction opposite the first direction; and
      the second distance is greater than the first distance.

2. The electronic device of claim 1, wherein:
   the electronic device further comprises:
      a cover glass affixed to the housing; and
      a display positioned below the cover glass;
   the electronic device is a mobile telephone;
   the flexible switch is positioned below the input body and further comprises a proximal end opposite the distal end;
   the connector terminus is offset from the input body along a perpendicular axis; and
   the second distance is at least five times greater than the first distance.

3. The electronic device of claim 2, wherein the proximal end is configured to move the second distance.

4. The electronic device of claim 1, further comprising an internal support; wherein
   the flexible switch is configured to lie flat against the internal support in response to motion of the input body.

5. The electronic device of claim 1, wherein:
   the electronic device further comprises an internal support coupled to the housing and defining a recess;
   the input body is configured to move into the recess; and
   a portion of the flexible switch is configured to move into the recess.

6. The electronic device of claim 5, wherein the internal support comprises:
   a flat base; and
   an angled sidewall, such that the flat base and angled sidewall define an obtuse angle within the recess.

7. The electronic device of claim 6, wherein the flexible switch is configured to lie flat against the flat base and the angled sidewall.

8. An electronic device, comprising:
   a housing;
   an input body connected to the housing and configured to move in response to an input;
   a flexible switch below the input body and comprising a distal end; and
   a connector terminus configured to electrically contact the distal end; wherein:
      the input body is configured to move a first distance;

the flexible switch is configured to deform in response to the input body moving the first distance, thereby moving the distal end a second distance; and the second distance is greater than the first distance.

9. The electronic device of claim 8, wherein the connector terminus electrically contacts the distal end when the input body is in a rest state.

10. The electronic device of claim 8, wherein the connector terminus is configured to break electrical contact with the distal end in response to the input body moving.

11. The electronic device of claim 8, wherein the distal end is offset along a perpendicular axis from the input body.

12. The electronic device of claim 8, further comprising a second connector terminus configured to form a second electrical connection with a proximal end of the flexible switch.

13. The electronic device of claim 8, wherein the second distance is at least ten times greater than the first distance.

14. The electronic device of claim 8, wherein the electronic device is a mobile phone or a watch.

15. An electronic device, comprising:
a housing defining an internal volume and an opening;
an input body comprising an input surface, the input body configured to move into the internal volume in response to a force input on the input surface;
a flexible switch below the input body and having a first, a second, and a third connector point, each of the first, second, and third connector points offset from the input body; and
multiple connector termini disposed within the internal volume, each connector terminus of the multiple connector termini configured to form an electrical connection with one of the connector points; wherein:
the input body is configured to operate in a first state, a second state, and a third state;
the input body moves a first distance to assume the second state;
the input body moves a second distance to assume the third state, the second distance being greater than the first distance;
the first connector point contacts a first connector terminus to form a single electrical connection in the second state;
the first, the second, and the third connector points contact the first, a second, and a third connector termini, respectively, in the third state; and
no electrical connection is formed in the first state.

16. The electronic device of claim 15, wherein the second connector point is positioned between the first and the third connector points.

17. The electronic device of claim 15, further comprising a processor configured to output a switch-on signal if at least two electrical connections are made.

18. The electronic device of claim 15, further comprising a processor configured to output a switch-on signal if:
the first connector point forms an electrical connection; and
at least one of the second and the third connector points form an electrical connection.

19. An electronic device comprising:
a housing defining an internal volume and an opening;
an input body comprising an input surface, the input body configured to move into the internal volume in response to a force input on the input surface;
a flexible switch positioned below the input body;
a push rod positioned below the input body and configured to move with the input body;
a button retainer positioned below the input body and configured to receive the push rod; and
a sheet positioned below the push rod and configured to seal the flexible switch.

* * * * *